(12) United States Patent
Schlacter

(10) Patent No.: US 7,164,290 B2
(45) Date of Patent: Jan. 16, 2007

(54) FIELD PROGRAMMABLE GATE ARRAY LOGIC UNIT AND ITS CLUSTER

(75) Inventor: Guy Schlacter, Buffalo Grove, IL (US)

(73) Assignee: KLP International, Ltd., Santa Clara, CA (US)

( * ) Notice: Subject to any disclaimer, the term of this patent is extended or adjusted under 35 U.S.C. 154(b) by 87 days.

(21) Appl. No.: 10/974,107

(22) Filed: Oct. 26, 2004

(65) Prior Publication Data

US 2005/0275428 A1      Dec. 15, 2005

Related U.S. Application Data

(63) Continuation-in-part of application No. 10/916,232, filed on Aug. 11, 2004.

(60) Provisional application No. 60/578,597, filed on Jun. 10, 2004.

(51) Int. Cl.
*H03K 19/177* (2006.01)
*G06F 7/42* (2006.01)

(52) U.S. Cl. .............................. 326/40; 326/38; 326/39; 708/490; 708/505; 708/603; 708/670

(58) Field of Classification Search .................. 326/39, 326/40
See application file for complete search history.

(56) References Cited

U.S. PATENT DOCUMENTS

| 3,634,929 A | 1/1972 | Yoshida et al. |
| 4,322,822 A | 3/1982 | McPherson |
| 4,488,262 A | 12/1984 | Basire et al. |
| 4,490,900 A | 1/1985 | Chiu |
| 4,502,208 A | 3/1985 | McPherson |
| 4,507,757 A | 3/1985 | McElroy |
| 4,543,594 A | 9/1985 | Mohsen et al. |
| 4,546,273 A | 10/1985 | Osman |
| 4,599,705 A | 7/1986 | Holmberg et al. |

(Continued)

FOREIGN PATENT DOCUMENTS

EP       0 295 935       12/1988

(Continued)

OTHER PUBLICATIONS

U.S. Appl. No. 09/629,570, Bourassa et al.

(Continued)

*Primary Examiner*—Vibol Tan
(74) *Attorney, Agent, or Firm*—Perkins Coie LLP

(57) ABSTRACT

The embodiments of the present invention relate to the general area of the Field Programmable Gate Arrays, and, in particular to the architecture and the structure of the building blocks of the Field Programmable Gate Arrays. The proposed logic units, as separate units or cluster of units, which are mainly comprised of look-up tables, multiplexers, and a latch, implement functions such as addition, subtraction, multiplication, and can perform as shift registers, finite state machines, multiplexers, accumulators, counters, multi-level random logic, and look-up tables, among other functions. Having two outputs, the embodiments of the logic unit can operate in split-mode and perform two separate logic and/or arithmetic functions at the same time. Clusters of the proposed logic units, which utilize local interconnections instead of traditional routing channels, add to efficiency, speed, and reduce required real estate.

33 Claims, 24 Drawing Sheets

Logic Head Diagram

U.S. PATENT DOCUMENTS

| Patent | Date | Inventor |
|---|---|---|
| 4,613,886 A | 9/1986 | Chwang |
| 4,677,742 A | 7/1987 | Johnson |
| 4,758,745 A | 7/1988 | El Gamal et al. |
| 4,758,988 A | 7/1988 | Kuo |
| 4,794,562 A | 12/1988 | Kato et al. |
| 4,823,181 A | 4/1989 | Mohsen et al. |
| 4,870,302 A | 9/1989 | Freeman |
| 4,876,220 A | 10/1989 | Mohsen et al. |
| 4,899,205 A | 2/1990 | Hamdy et al. |
| 4,943,538 A | 7/1990 | Mohsen et al. |
| 4,962,342 A | 10/1990 | Mead et al. |
| 5,138,410 A | 8/1992 | Takebuchi |
| 5,150,179 A | 9/1992 | Gill |
| 5,303,185 A | 4/1994 | Hazani |
| 5,304,871 A | 4/1994 | Dharmarajan et al. |
| 5,323,342 A | 6/1994 | Wada et al. |
| 5,412,244 A | 5/1995 | Hamdy et al. |
| 5,455,525 A | 10/1995 | Ho et al. |
| 5,477,499 A | 12/1995 | Van Buskirk et al. |
| 5,496,756 A | 3/1996 | Sharma et al. |
| 5,576,568 A | 11/1996 | Kowshik |
| 5,578,848 A | 11/1996 | Kwong et al. |
| 5,586,270 A | 12/1996 | Rotier et al. |
| 5,587,603 A | 12/1996 | Kowshik |
| 5,600,265 A | 2/1997 | El Gamal et al. |
| 5,650,336 A | 7/1997 | Eriguchi et al. |
| 5,675,541 A | 10/1997 | Leterrier |
| 5,675,547 A | 10/1997 | Koga |
| 5,745,417 A | 4/1998 | Kobayashi et al. |
| 5,781,032 A | 7/1998 | Bertolet et al. |
| 5,784,636 A | 7/1998 | Rupp |
| 5,825,200 A | 10/1998 | Kolze |
| 5,825,201 A | 10/1998 | Kolze |
| 5,880,512 A | 3/1999 | Gordon et al. |
| 5,889,411 A | 3/1999 | Chaudhary |
| 5,892,962 A | 4/1999 | Cloutier |
| 5,907,248 A * | 5/1999 | Bauer et al. ............ 326/39 |
| 5,909,049 A | 6/1999 | McCollum |
| 5,920,202 A * | 7/1999 | Young et al. ............ 326/39 |
| 5,929,482 A | 7/1999 | Kawakami |
| 5,949,712 A | 9/1999 | Rao et al. |
| 5,986,931 A | 11/1999 | Caywood |
| 5,986,939 A | 11/1999 | Yamada |
| 6,016,268 A | 1/2000 | Worley |
| 6,031,761 A | 2/2000 | Ghilardelli et al. |
| 6,034,893 A | 3/2000 | Mehta |
| 6,040,968 A | 3/2000 | Duvvury et al. |
| 6,044,012 A | 3/2000 | Rao et al. |
| 6,047,243 A | 4/2000 | Bang |
| 6,055,205 A | 4/2000 | Rao et al. |
| 6,064,225 A | 5/2000 | Andrews et al. |
| 6,064,595 A | 5/2000 | Logie et al. |
| 6,077,719 A | 6/2000 | Koike |
| 6,084,428 A | 7/2000 | Kolze et al. |
| 6,097,077 A | 8/2000 | Gordon et al. |
| 6,107,822 A * | 8/2000 | Mendel et al. ............ 326/39 |
| 6,153,463 A | 11/2000 | Wei et al. |
| 6,157,568 A | 12/2000 | Schmidt |
| 6,166,954 A | 12/2000 | Chern |
| 6,177,830 B1 | 1/2001 | Rao |
| 6,198,652 B1 | 3/2001 | Kawakubo |
| 6,214,666 B1 | 4/2001 | Mehta |
| 6,215,140 B1 | 4/2001 | Reisinger et al. |
| 6,218,274 B1 | 4/2001 | Komatsu |
| 6,232,631 B1 | 5/2001 | Schmidt et al. |
| 6,236,229 B1 | 5/2001 | Or-Bach |
| 6,249,809 B1 | 6/2001 | Bro |
| 6,282,123 B1 | 8/2001 | Mehta |
| 6,294,809 B1 | 9/2001 | Logie |
| 6,297,103 B1 | 10/2001 | Ahn et al. |
| 6,304,666 B1 | 10/2001 | Warren et al. |
| 6,337,250 B1 | 1/2002 | Furuhata |
| 6,351,428 B1 | 2/2002 | Forbes |
| 6,421,293 B1 | 7/2002 | Candelier et al. |
| 6,431,456 B1 | 8/2002 | Nishizawa et al. |
| 6,445,619 B1 | 9/2002 | Mihnea et al. |
| 6,456,535 B1 | 9/2002 | Forbes et al. |
| 6,459,634 B1 | 10/2002 | Sher |
| 6,476,636 B1 | 11/2002 | Lien et al. |
| 6,515,509 B1 | 2/2003 | Baxter |
| 6,556,481 B1 | 4/2003 | Hsu et al. |
| 6,602,729 B1 | 8/2003 | Lin |
| 6,633,182 B1 | 10/2003 | Pileggi et al. |
| 6,650,143 B1 | 11/2003 | Peng |
| 6,674,670 B1 | 1/2004 | Jeung |
| 6,678,646 B1 | 1/2004 | McConnell et al. |
| 6,700,151 B1 | 3/2004 | Peng |
| 6,753,590 B1 | 6/2004 | Fifield et al. |
| 6,754,881 B1 | 6/2004 | Kuhlmann et al. |
| 6,774,670 B1 * | 8/2004 | Feng et al. ............ 326/41 |
| 6,777,757 B1 | 8/2004 | Peng et al. |
| 6,862,205 B1 | 3/2005 | Agata et al. |
| 2001/0003374 A1 | 6/2001 | Bohmer et al. |
| 2003/0218920 A1 | 11/2003 | Harari |

FOREIGN PATENT DOCUMENTS

JP                61292295               12/1986

OTHER PUBLICATIONS

Wu, E.W. et al; Voltage-Dependent Voltage-Acceleration of Oxide Breakdown for Ultra-Thin Oxides; IEEE, 2000, pp. 1-4. no month.

Sune, Jordi et al; Post Soft Breakdown Conduction in SiO2 Gate Oxides; IEEE, 2000, pp. 1-4, no month.

DeGraaf, C., et al, A Novel High-Density Low-Cost Diode Programmable Read Only Memory, IEEE, 1996, pp. 7.6.1-7.6.4, no month.

Rasras, Mahmoud et al; Substrate Hole Current Origin After Oxide Breakdown; IEEE, 2000, pp. 1-4, no month.

Lombardo, S. et al; Softening of Breakdown in Ultra-Thin Gate Oxide nMOSFET's at Low Inversion Layer Density; 39th Annual International Reliability Physics Symposium; Orlando, FL 2001, pp. 163-169, no month.

Miranda, Enrique et al; Analytic Modeling of Leakage Current Through Multiple Breakdown Paths in SiO2 Films; 39th Annual International Reliability Physics Symposium; Orlando, FL 2001, pp. 369-379, no month.

* cited by examiner

Logic Head Diagram

LUT4 & Register Pack Configuration

Split Mode Configuration

Adder Mode Configuration
two bits per LH

Subtractor Mode Configuration two bits per LH

LHC: Count Chain

FIELD PROGRAMMABLE GATE ARRAY LOGIC UNIT AND ITS CLUSTER

CROSS-REFERENCE TO RELATED APPLICATION(S)

This application is a continuation-in-part (CIP) of application No. 10/916,232, filed Aug. 11, 2004, which claims benefit to U.S. Provisional Patent Application No. 60/578,597, filed Jun. 10, 2004, the disclosures of which are hereby incorporated by reference in their entirety.

TECHNICAL FIELD

This invention relates to the field of Field Programmable Gate Arrays (FPGAs). In particular it relates to the architecture of FPGA building blocks and their clusters.

BACKGROUND

A digital logic circuit, generally formed as a cascade of separate logic functions, is a circuit that produces a digital output as a result of some logical operation on its digital inputs. Digital logic circuits are typically implemented on various types of integrated semiconductor chips. One widely known type of integrated chip is the Application Specific Integrated Circuit (ASIC), which is a custom-made integrated chip. Each ASIC is manufactured to implement a specific digital logic circuit.

Programmable chips are another type of integrated chips, but differ from ASICs because of their ability to implement any number of different complex digital logic circuits by configuring the underlying integrated chip. The programmable integrated chips are less costly, usually in a limited volume, than ASICs because a large number of similar integrated chips may be manufactured from a single design, which can later be configured to implement a wide variety of digital logic circuits. For this reason the cost of design and manufacturing is distributed over a large number of integrated chips.

FPGA is one type of programmable integrated chips. The FPGA can either be permanently programmed by the user, such as in the U.S. Pat. No. 4,758,745 by El Gamal, et al., or can be temporarily programmed by the user, described in the U.S. Pat. No. 4,870,302, by Freeman.

Typically an FPGA consists of an array of modularized logic units and interconnection resources. It is an array of uncommitted gates with uncommitted wiring channels. Each logic unit can be programmed to implement a particular logic function. Various digital circuits may be implemented to execute desired functions by programming a number of logic blocks and interconnecting them using interconnection resources.

In other words, to implement a particular circuit function, the circuit is mapped into the array and the wiring channels and appropriate connections are programmed to implement the necessary wiring connections that form the circuit function. A gate array circuit can be programmed to implement virtually any set of functions.

Of utmost importance in designing an FPGA is the topology of the logic units and the interconnection resources since different FPGA architecture provides different performance characteristics. Also, the programming of a gate array and the mapping of a desired functionality onto it depend upon the topology of the gate array. If the logic units of the gate array are high level blocks, such as counters, parity generators, and the like, then the amount of programming required is limited to the interconnections among these large- or coarse-grain units.

If, on the other hand, the logic units of the gate array are low level blocks, such as gates, latches, and the like, then the amount of programming is significantly higher, because these smaller, or fine-grain, units need to be interconnected to effect the higher level functions. In some designs the use of the fine-grain units results in higher circuit densities because the desired functions can be implemented more efficiently with small low-level units rather than with larger high-level units whose high level functionality is useless in the particular circumstances.

A highly complex logic unit may be able to perform a large number of complex operations but if a relatively simple operation is desired much of the functionality and semiconductor real estate will be wasted. At the same time, a logic unit consisting of basic logic gates requires extensive wiring to perform sophisticated operations. In other words, some complex designs cannot be efficiently embodied in a fine-grain gate array, because the amount of interconnection required among the low-level units exceed the capacity of the gate array.

Various architectures have been proposed to optimize the tradeoffs among circuit building blocks, routing efficiency, performance limits, and the like. There is a need for logic units or cluster of logic units that optimize flexibility and functionality of the FPGAs.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

The present invention relates to the general area of Field Programmable Gate Arrays. In particular it relates to the architecture of the logic units, hereinafter called "logic heads," and the "cluster" of such logic heads, hereinafter referred to as "LHC," that are the building blocks of the Field Programmable Gate Arrays. A cluster of the proposed logic heads does not require traditional channel-based routing resources, and as such improves efficiency in several areas. In the detailed description provided below, different embodiments of the proposed logic head is disclosed and some of their functional capabilities are illustrated, for example implementing functions such as addition, subtraction, multiplication, multi-level random logic, or acting as shift registers, finite state machines, multiplexers, accumulators, counters, look-up tables. In addition, some of the advantages of clustering logic heads are described and a few of the functional capabilities of the clusters will be also presented.

In one embodiment, the proposed logic head is comprised of 3-input look-up tables, a plurality of multiplexers, two XOR gates, and a register. The logic function of each logic head is determined by the content of its look-up tables and the appropriate routing of its internal signals. One of the advantages of this invention is that each logic head can operate in split-mode, and perform two separate functions in parallel or in series. Another advantage of this invention is the performance of 2-bit arithmetic functions by a single logic head. Yet another advantage of this invention is the ability to form cascading chain of multiplexers to serve various purposes.

Furthermore, without requiring traditional channel-based routing resources, a logic head cluster, which comprises multiple logic heads and local routing resources, can form one or more multiple-input universal function generators, multiplexers, arithmetic logic units, counters, finite state machines, and multiple-stage random logic such as AOI (And-Or-Invert). Clustering greatly improves logic efficiency in addition to significantly enhancing the performance. Clusters can also be connected together, using minimum conventional routing resources, to perform functions beyond the capabilities of a single cluster.

Figure 1:
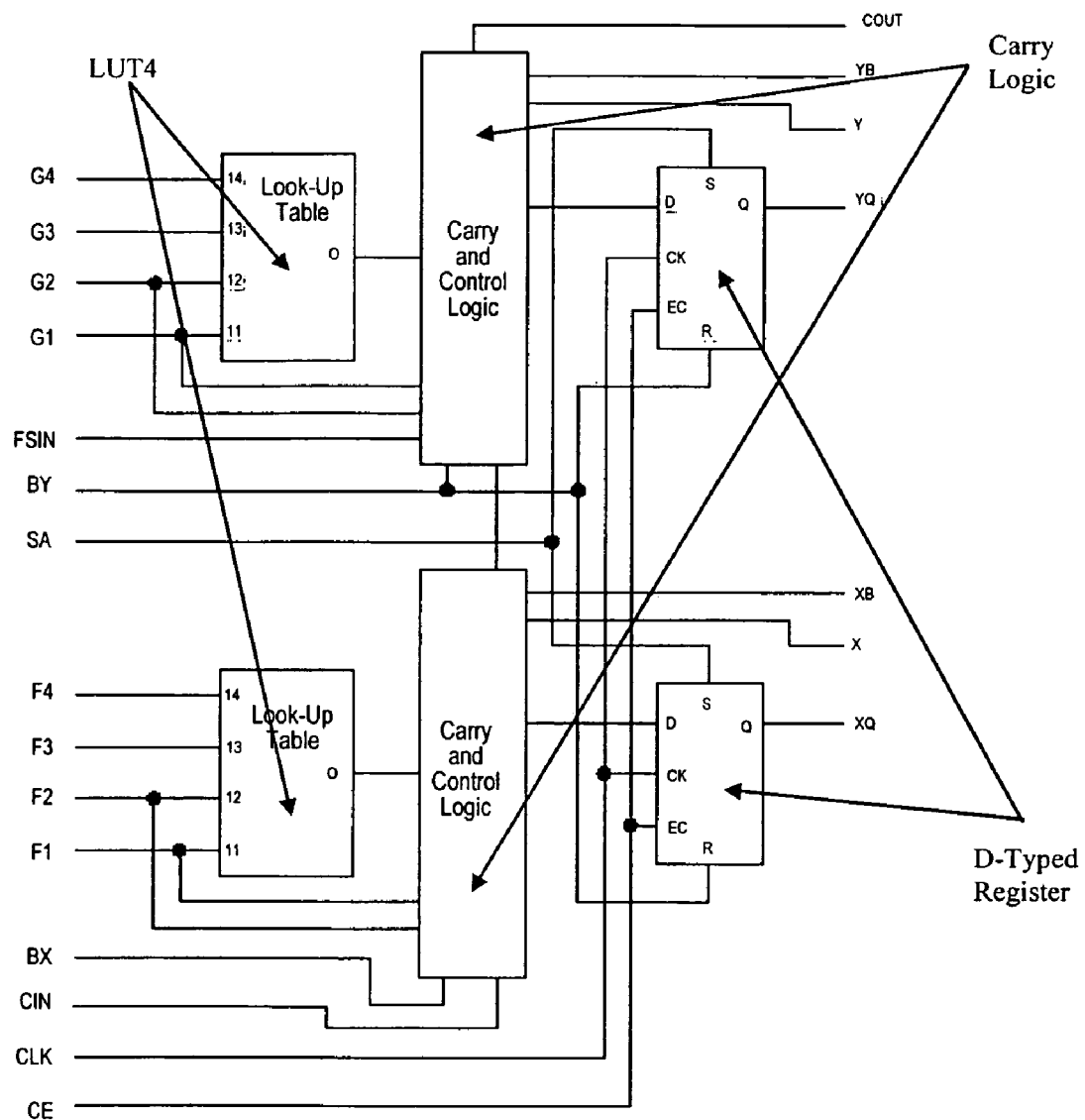
FIGS. 1–4 are schematic circuit diagrams of FPGA logic units in accordance with the prior art.
Figure 2:
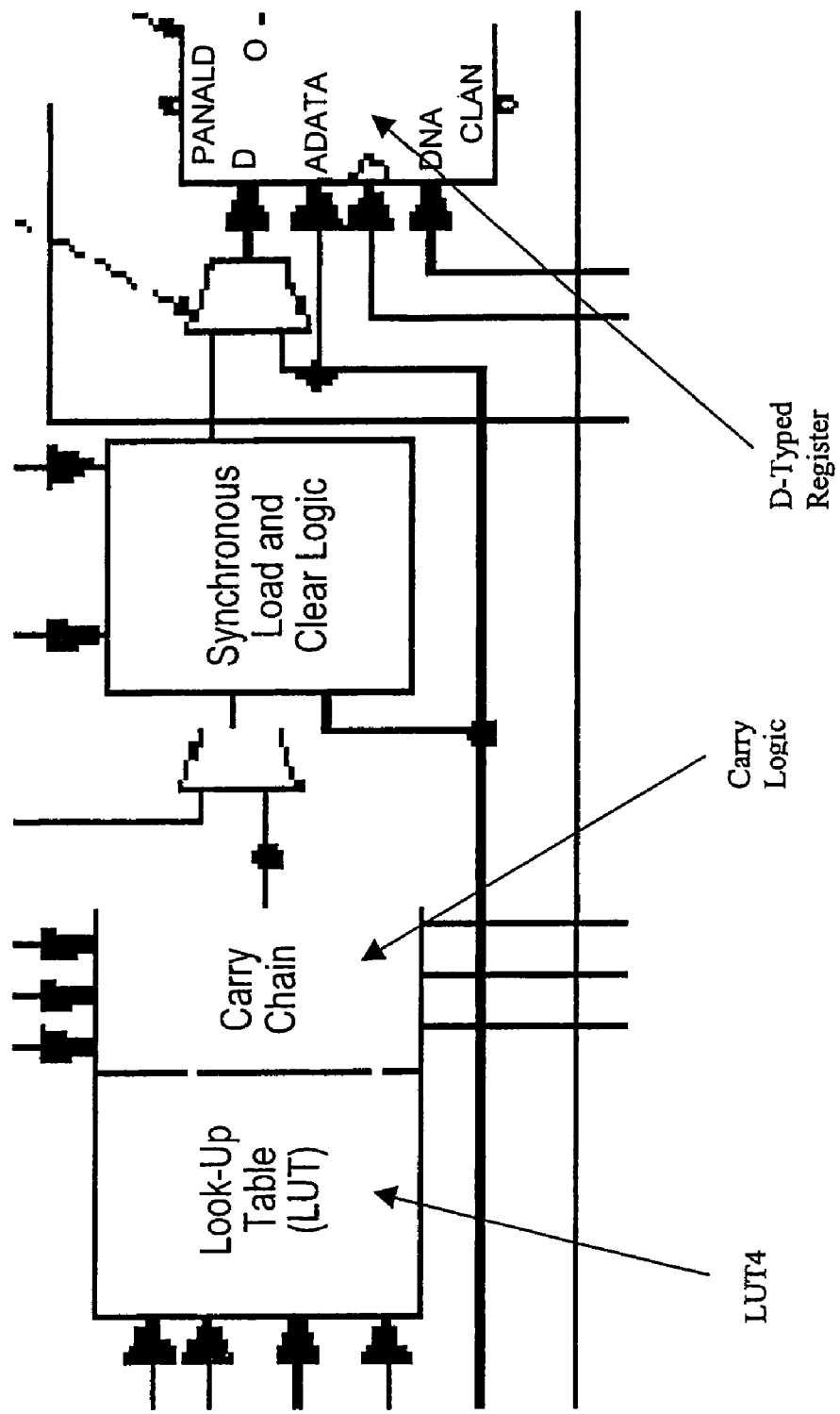
Figure 3:
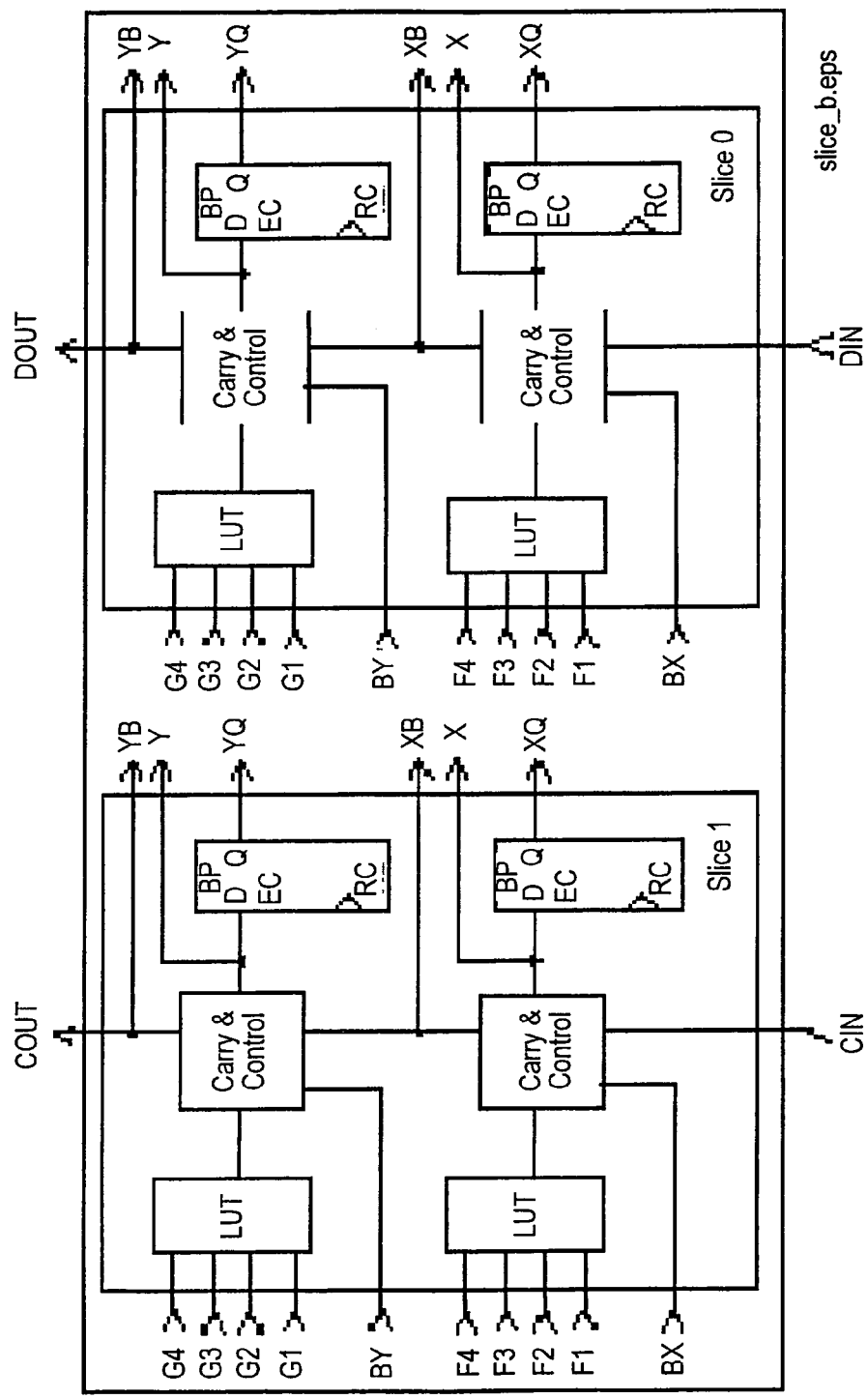
Figure 4:
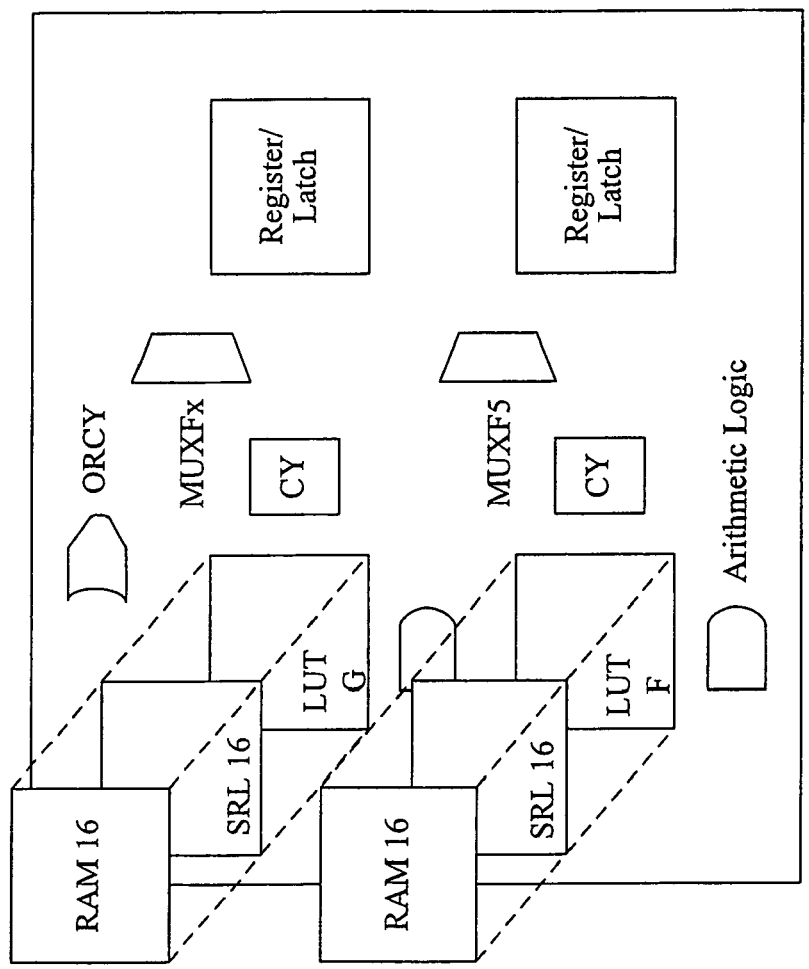

On the other hand the logic units of most of the prior art FPGAs require 4-input look-up tables, dedicated carry logic, and multiple registers, which make them more complicated while performing the same or fewer functions. FIGS. 1, 2, 3, and 4 are schematic circuit diagrams of FPGA logic units in accordance with the prior art and the presently available commercial FPGAs. A few of the presently available commercial logic unit structures use 3-input look-up tables to implement logic functions, as indicated in the U.S. Pat. No. 6,476,636 by Jung-Cheun Lien and the U.S. Pat. No. 6,236,229 by Zvi Or-Bach. Also, regarding the cascading techniques, some prior arts include Altera's 10K family, which uses an AND gate, and Xilinx Virtex-architecture, which uses dedicated 2-to-1 multiplexers, as illustrated in FIG. 4.

The embodiments of the present invention are significantly different from the prior art. At the core of the prior art implementations are, predominantly, single logic elements producing single combinatorial functions alongside arithmetic and register resources. The embodiments of the present invention have expanded the flexibility of the logic units by, among other advantages, providing for split-mode dual combinatorial capabilities, which are supported by the two independent Logic Head outputs, and by the possibility of the formation of cascading logic chains, which employs dynamic multiplexers.

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Figure 5:
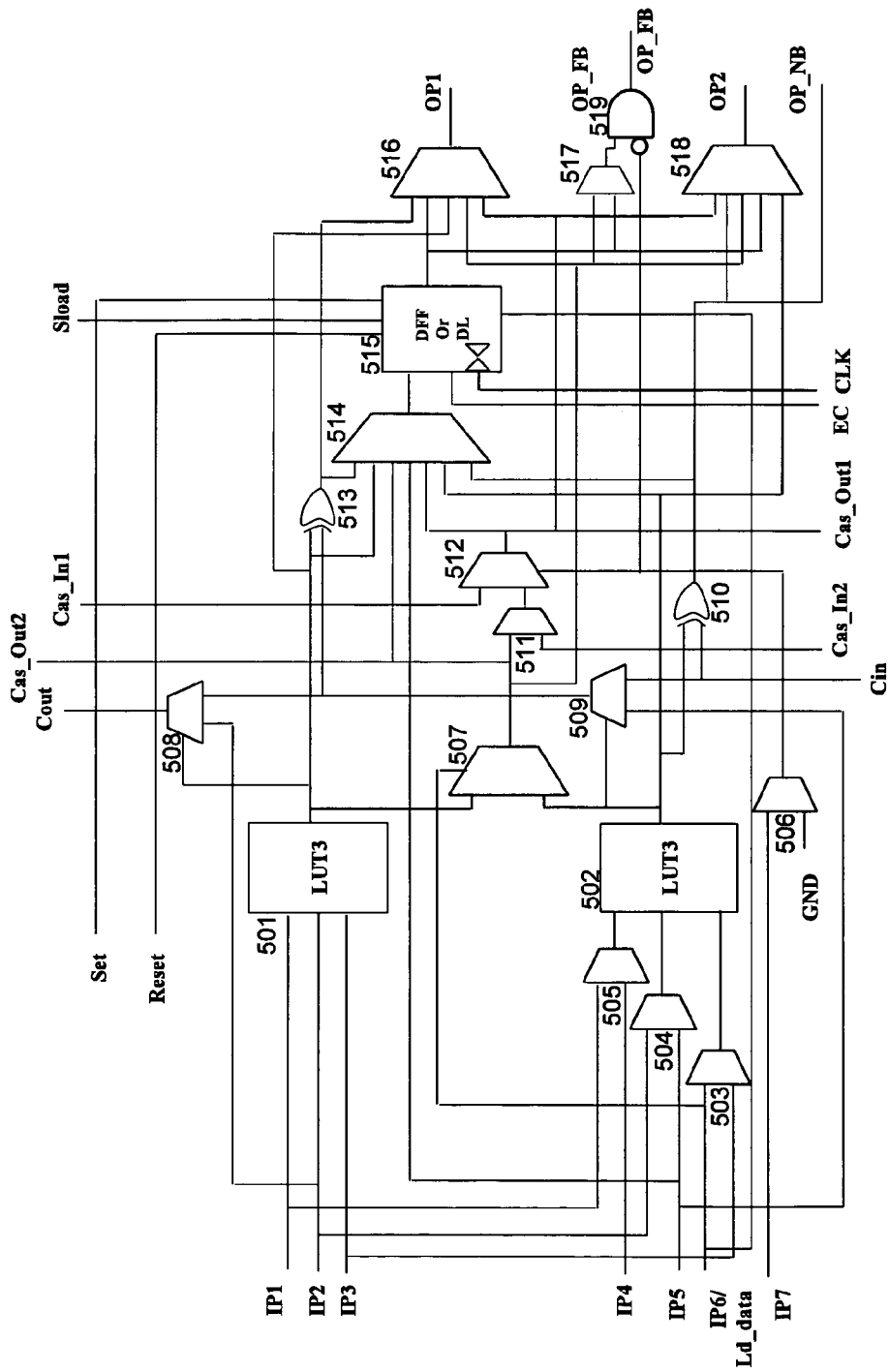
FIG. 5 is a schematic circuit diagram of a logic head, in accordance with an embodiment of the invention.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments. FIG. 5 is a schematic circuit diagram of a logic head, in accordance with an embodiment of the present invention. In this embodiment a logic head has seven inputs, five control signals (clock, clock enable, reset, set, synchronous load), two outputs (OP1 and OP2), two outputs for dedicated feedback or dedicated feedforward connections (OP_FB and OP_NB, respectively), a carry-in, a carry-out, two cascade-in, and two cascade-out ports. It further comprises two 3-input look-up tables (LUT3), four dynamic (standard) 2-to-1 multiplexers, a D flip-flop (DFF) or latch, nine different size hard-wired multiplexers, and two 2-input XORs. In this embodiment, IP1 through IP7 represent data inputs and are shared between the two LUT3s.

The two LUT3s of each logic head can implement a LUT4 with the help of a 2-to-1 dynamic multiplexer. The two LUT3s can also produce two LUT3s, two LUT2s, or one LUT3 and one LUT2, in parallel. The registered or the non-registered outputs of the two LUT3s , LUT2s , LUT4, or some of the inputs of the logic head can be routed to either of its two outputs, OP1 or OP2. Feeding back one or both of the outputs helps implementing additional functionality such as counting, accumulating, finite state machines, or multi-level random logic. The provided D flip-flop, in addition to serving the logic head or its neighboring logic heads, may be used along with the D flip-flops of other logic heads to form a register chain. Furthermore, a single logic head, without the need of dedicated carry logic, can implement a two-bit full adder, subtractor, or accumulator.

Besides the combinatorial mode, the proposed logic head has optimized modes for multiplexing, and arithmetic functions. A single logic head can implement a two-bit full adder-subtractor, or a two-bit accumulator or counter by borrowing a register from its right neighbor. In addition, by cascading multiple logic heads within a cluster, the followings functions may be efficiently implemented:
5- through 8-input look-up tables;
4-to-1 through 64-to-1 Multiplexers;
Up to 32-bit full adder, subtractor, accumulator or counter;
Up to 16-state finite state machine;
Up to 32-level random logic or pipeline;
16-bit deep shift register;

In the following paragraphs, different embodiments of the invention will demonstrate how a logic head is programmed to implement any of the above-mentioned functions. In the figures, the internal signal flow of the logic head, related to its function, is illustrated with a broken line. Based on these examples, and their associated figures, a person of ordinary skill in the relevant art will be able to program and configure such circuits and control or hard-wire, the multiplexers, to perform a desired function mentioned herein. (Hereinafter "hard-wiring" of a multiplexer will be referred to as "programming" the multiplexer)

Figure 6:
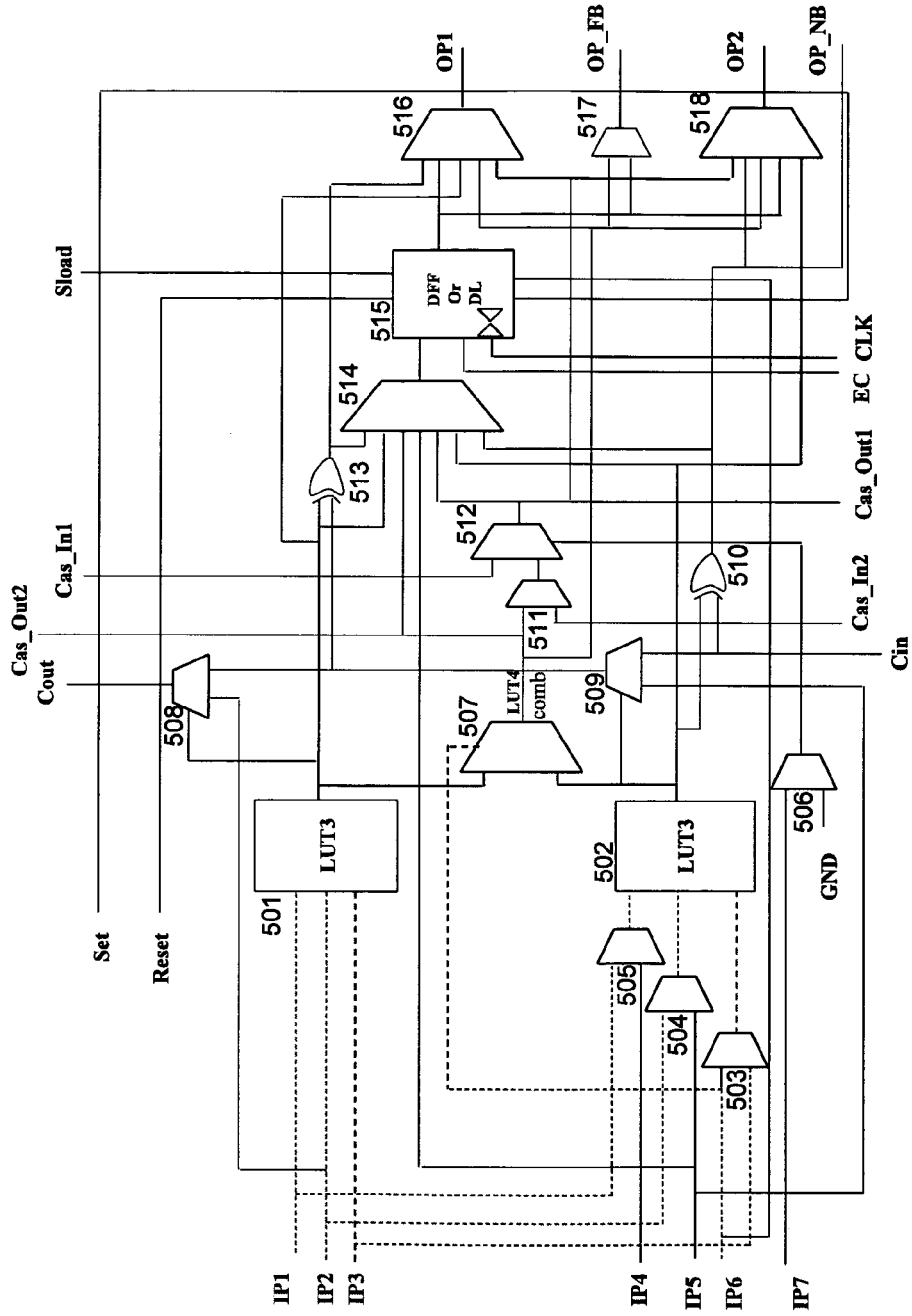
FIG. 6 depicts a logic head while operating as a 4-input look-up table, in accordance with another embodiment of the invention.

FIG. 6 depicts a logic head while operating as a 4-input look-up table, in accordance with another embodiment of the invention. Each 3-input look-up table has $2^3$ memory bits. The two of them together are capable of addressing $2(2^3)$ or $2^4$ data bits, which is the same as the number of possible combinations of a 4-input logic gate. Therefore, to use the logic head of FIG. 5 as a 4-input logic gate, IP1, IP2, IP3, and IP6 are chosen to be the inputs to the logic gate, and multiplexers 503, 504, and 505 are programmed so that LUT3 501 and 502 both receive IP1, IP2, and IP3 as their inputs. In this way IP6 is used to control multiplexer 507 and choose between the two LUT3 outputs.

In this arrangement, the desired outcome of all the logic combinations in which IP6=0 must be stored in one LUT3 and the ones with IP6=1 must be stored in the other LUT3. If the non-registered version of the output of multiplexer 507, which is effectively the output of the desired "4-input logic gate," is needed, it can be furnished at OP1 and/or OP2 by programming multiplexers 516 and/or 518, respectively.

But if the registered version of the output of multiplexer 507 is desired, appropriate programming of multiplexer 514 routes its output to the DFF 515 and from there programming of 516 and/or 518 will make the registered output available at OP1 and/or OP2, respectively. The very same arrangement creates a 4-input look-up table, a LUT4, as this arrangement makes $2^4$ memory bits available and addressable by IP1, IP2, IP3, and IP6. Furthermore, each LUT3 can be used separately to implement 1-, 2-, or 3-input logic gates, as each can provide $2^3$ bits of memory, which covers all possible combinations of up to 3 inputs.

Figure 7:
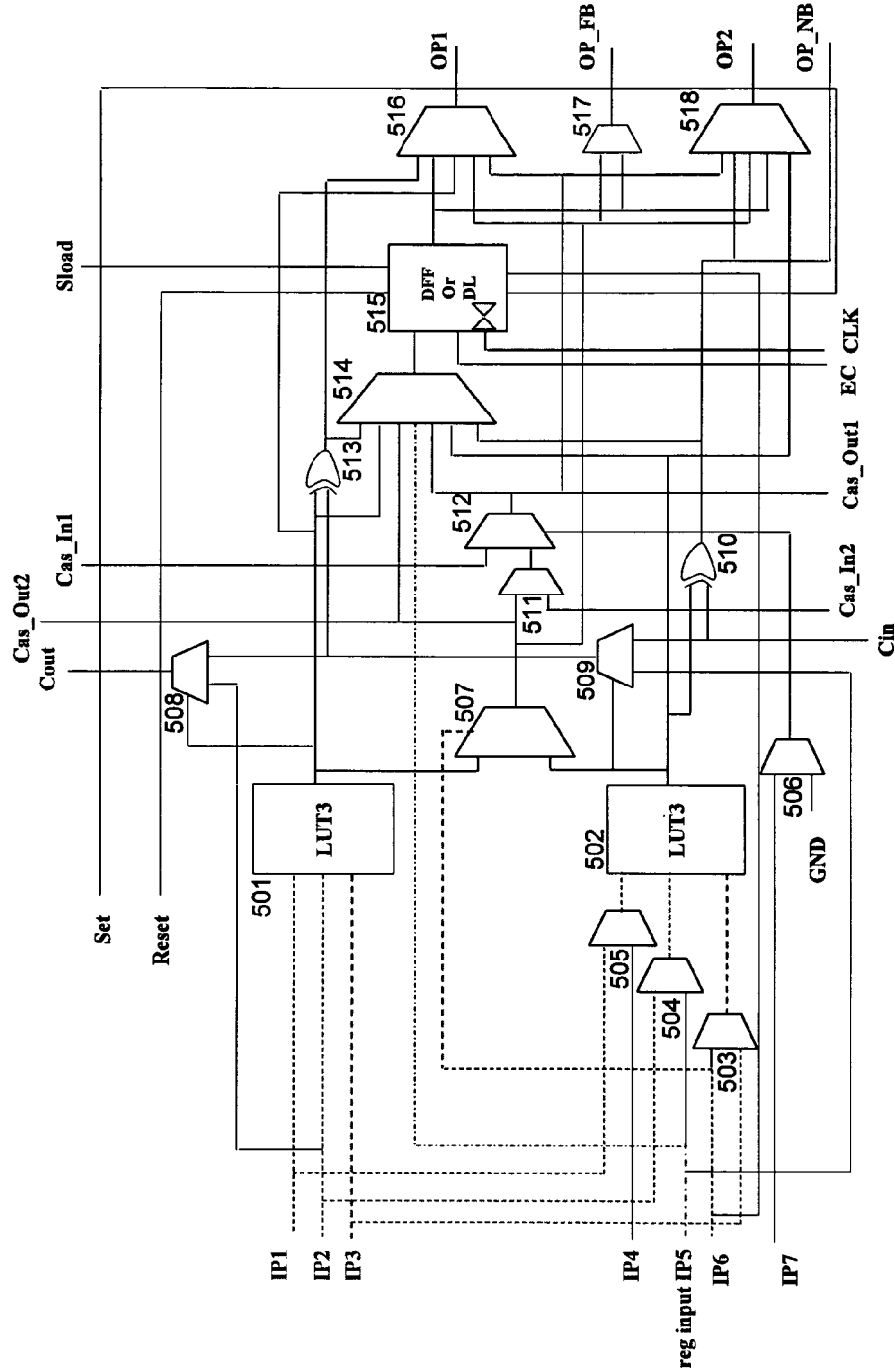
FIG. 7 depicts a logic head with its register used in a cascading chain of registers while also operating as a 4-input look-up table, in accordance with yet another embodiment of the invention.

FIG. 7 depicts a logic head with its register used in a cascading chain of registers while also operating as a 4-input look-up table, in accordance with yet another embodiment of the invention. The logic head in FIG. 7 has all the arrangements of the logic head of FIG. 6 in a non-registered output mode, while multiplexer 514 is programmed to pass IP5 through to the DFF 515 whose output in turn is available at any of the unused output ports.

Figure 8:
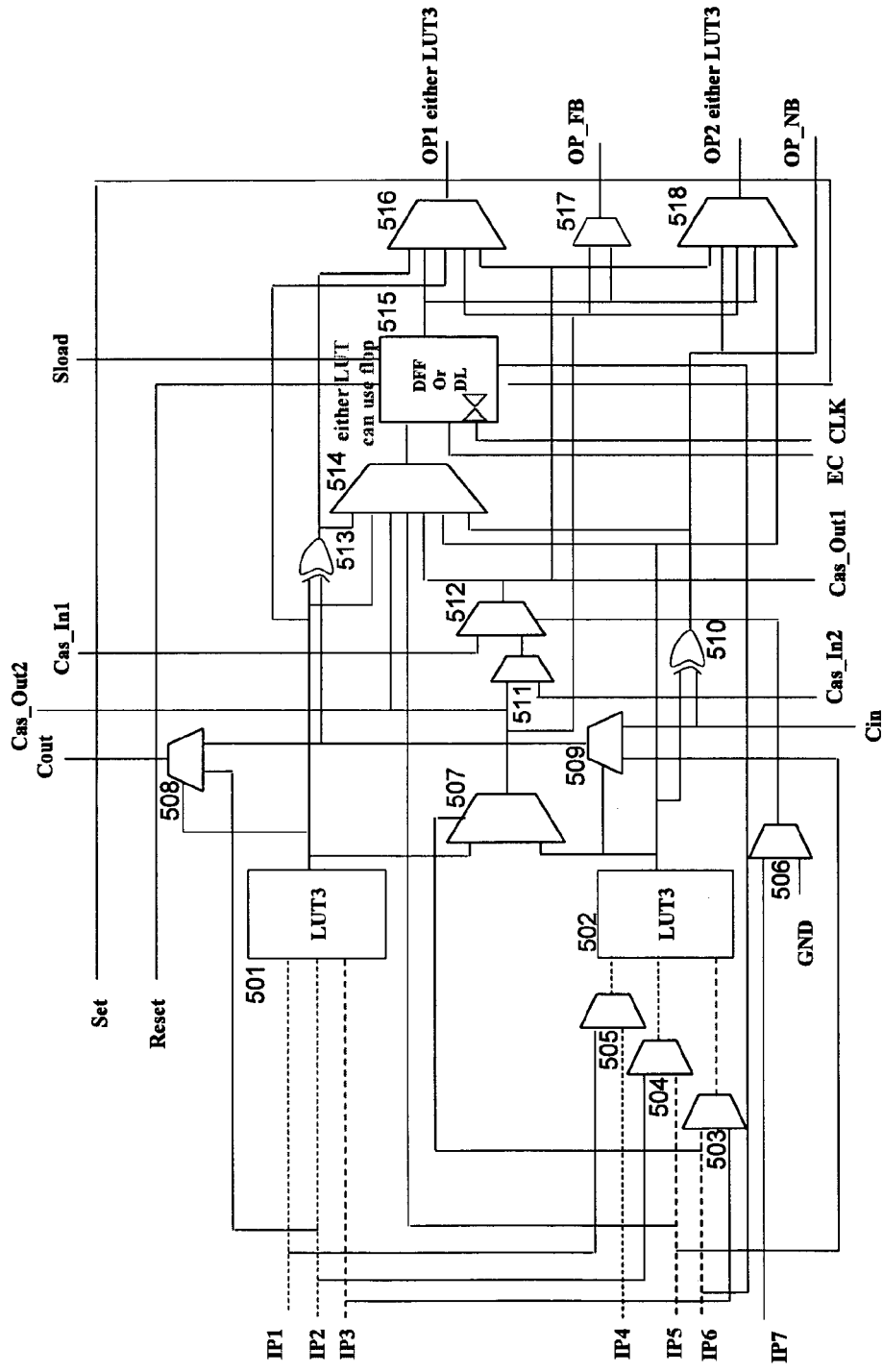
FIG. 8 depicts a logic head with both its LUT3s available in parallel, with either of their outputs available in registered or non-registered form, in accordance with yet another embodiment of the invention.

FIG. 8 depicts a logic head with both its LUT3s available in parallel, with either of their outputs available in registered or non-registered form, in accordance with yet another embodiment of the invention. Using IP1, IP2, and IP3 as inputs to LUT3 501, and IP4, IP5, and IP6 as inputs to LUT3 502, both LUT3s can be used separately, or in split-mode, by programming multiplexers 516 and 518. In addition, either of the separate LUT3s can use the DFF 515 if multiplexers 514 and 516 are programmed accordingly. The above explanation enables a person of ordinary skill in the appropriate art to easily use either or both of the LUT3s as LUT2s.

Figure 9:
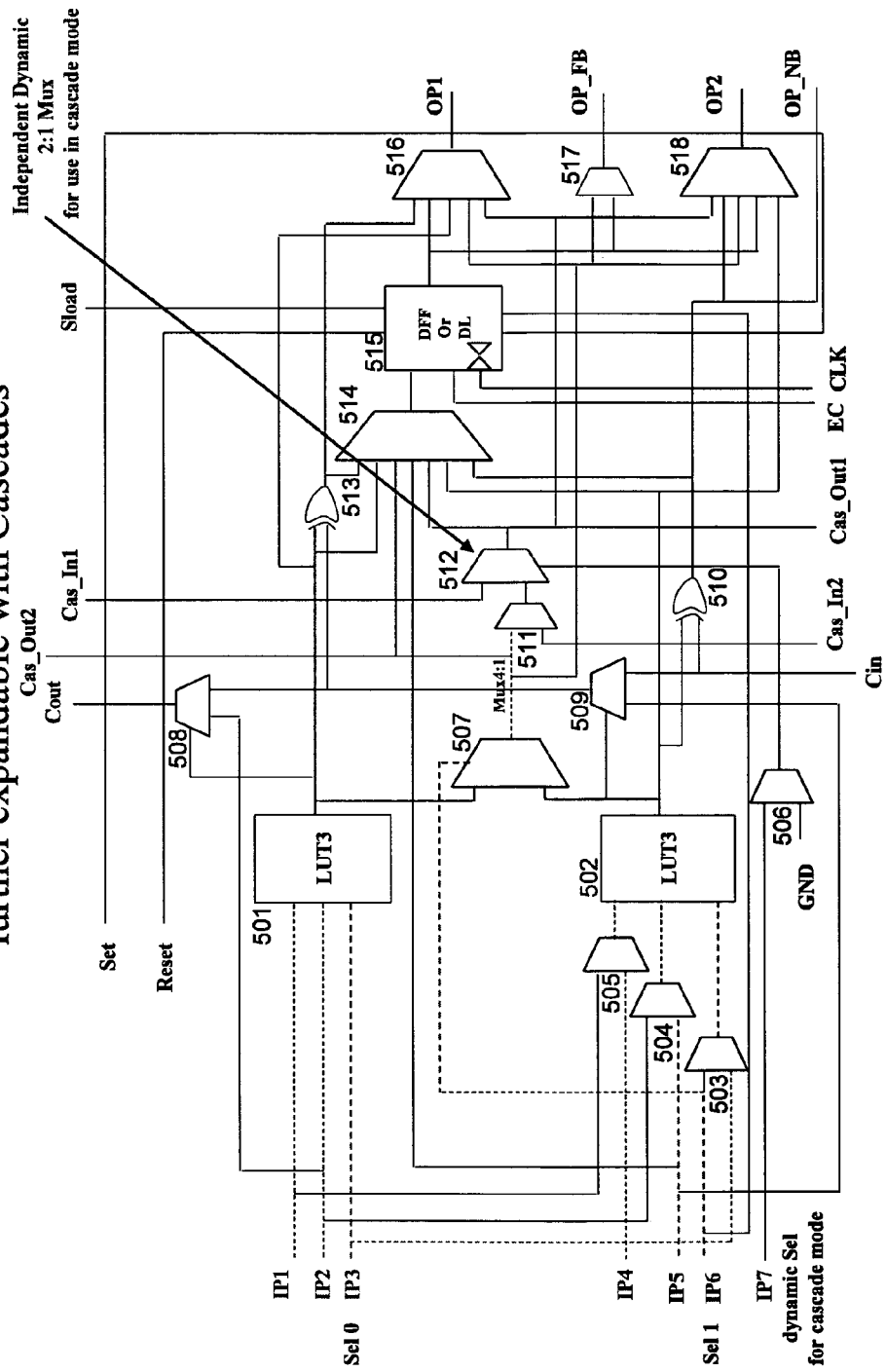
FIG. 9 illustrates a logic head operating as a 4-to-1 multiplexer, with the capability to join other logic heads to form wider-input multiplexers, in accordance with yet another embodiment of the invention.

FIG. 9 illustrates a logic head operating as a 4-to-1 multiplexer, with the capability to join other logic heads to form wider-input multiplexers, in accordance with yet another embodiment of the invention. IP1, IP2, IP4, and IP5 are the inputs of this multiplexer while IP3 and IP6 are the multiplexing address. This is accomplished, for example, by using IP1 through IP3 as input to LUT3 501; IP3 through IP5 as input to LUT3 502; IP6 controlling multiplexer 507; and by programming LUT3 501 to implement (IP3×IP1+ !IP3×IP2) and LUT3 502 to implement (IP3×IP4+!IP3× IP5). With such arrangements, the 4-to-1 multiplexed output of IP1, IP2, IP4, and IP5, provided at the output of multiplexer 507, will be:

$$Y=IP6\times(IP3\times IP1+!IP3\times IP2)+!IP6\times(IP3\times IP4+!IP3\times IP5)$$

Two logic heads in 4-to-1 multiplexing mode can implement an 8-to-1 multiplexer, using IP7 as its third address bit, if both multiplexer 511 and 512 are accordingly programmed and the two logic heads are properly connected, an example of which is later presented in this specification.

Figure 10:
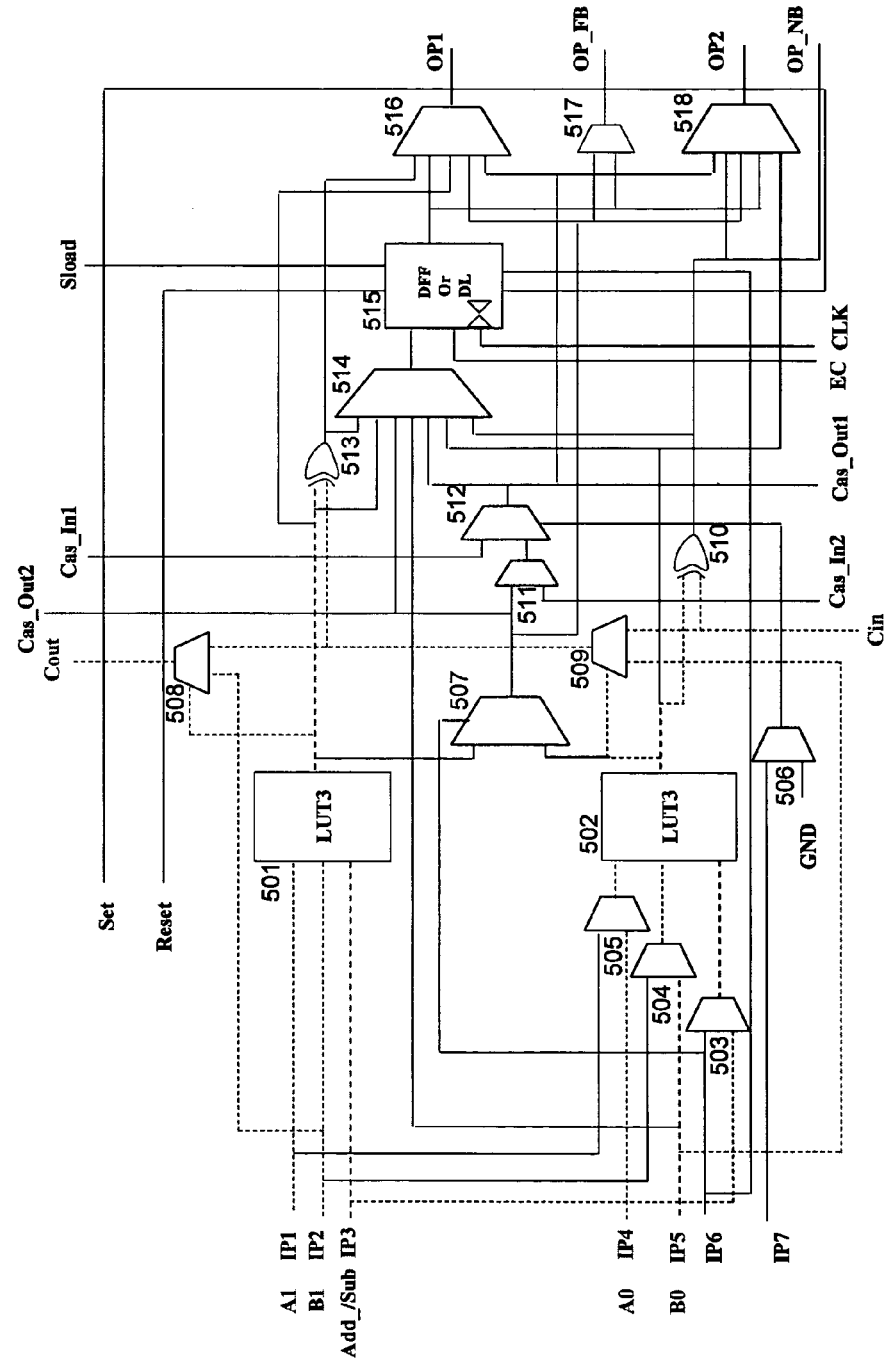
FIG. 10 illustrates a logic head operating as a 2-bit full-adder, in accordance with yet another embodiment of the invention.

FIG. 10 illustrates a logic head operating as a 2-bit full-adder, in accordance with yet another embodiment of the invention. Since a 1-bit full-adder is defined as a circuit which accepts two bits and an input carry, and which produces a sum bit and an output carry bit, each LUT3 of the logic head along with a standard 2-to-1 multiplexer and an XOR can be configured to function in the same manner. Therefore, by cascading the two 1-bit full-adders within a logic head, each logic head can perform a 2-bit full addition.

In a 2-bit full-adder configuration, IP4 and IP5 may represent the least significant bits, while IP1 and IP2 may represent the most significant bits of addends $A_1A_0$ and $B_1B_0$, respectively. In this configuration IP3, which inputs both LUT3s , controls whether the logic head performs an "add" or a "subtract" operation. (The "subtract" operation will be discussed in the following paragraphs.) For this arrangement multiplexers 503, 504, and 505 must be programmed to pass through IP3, IP5, and IP4, respectively. Each of the two possible states of IP3, in effect, divides a LUT3 into two equal segments, each with $2^2$ memory spaces, which can serve all possible combinations of the two addend bits.

In an "add" mode, LUT3 502 can be programmed such that:

(Output of LUT3 502) XOR $(C_{in})=(A_0+B_0+C_{in})$

With this arrangement the output of XOR gate 510 is the addition result of the least significant bits of the addends and the output of multiplexer 509, which is controlled by the output of LUT3 502, is the carry-out bit of the same addition. This is possible, for example, by programming LUT3 502 according to the following truth table. In the following tables, the darker lettering signifies the programming of the LUT3s and the lighter lettering signifies the result of such programming:

| IP3 | $A_0$ | $B_0$ | LUT3 502 output | MUX 509 output | XOR 510 output |
|---|---|---|---|---|---|
| Add | 0 | 0 | 0 | $B_0$ | $C_{in}$ |
| Add | 0 | 1 | 1 | $C_{in}$ | $!C_{in}$ |
| Add | 1 | 0 | 1 | $C_{in}$ | $!C_{in}$ |
| Add | 1 | 1 | 0 | $B_0$ | $C_{in}$ |

Similar arrangement is needed for the addition of the second most significant bits, while using the output of multiplexer 509 as its carry-in bit. Therefore, assuming IP3 signals an "add" operation, LUT3 501 is programmed such that:

(Output of 501) XOR (Output of 509)=$(A_1+B_1+$output of 509$)$ and the output of multiplexer 508, controlled by the output of LUT3 501 is the carry-out bit of the same addition. This is possible, for example, by programming LUT3 501 according to the following truth table:

| IP3 | $A_1$ | $B_1$ | LUT3 501 output | MUX 508 output | XOR 513 output |
|---|---|---|---|---|---|
| Add | 0 | 0 | 0 | $B_1$ | MUX 509 output |
| Add | 0 | 1 | 1 | MUX 509 output | !(MUX 509 output) |
| Add | 1 | 0 | 1 | MUX 509 output | !(MUX 509 output) |
| Add | 1 | 1 | 0 | $B_1$ | MUX 509 output |

In this configuration, for example, OP2 and OP1 can output the least and the most significant bits of the 2-bit addition result, respectively, while $C_{out}$ represents the carry-out bit of the same 2-bit addition.

Figure 11:
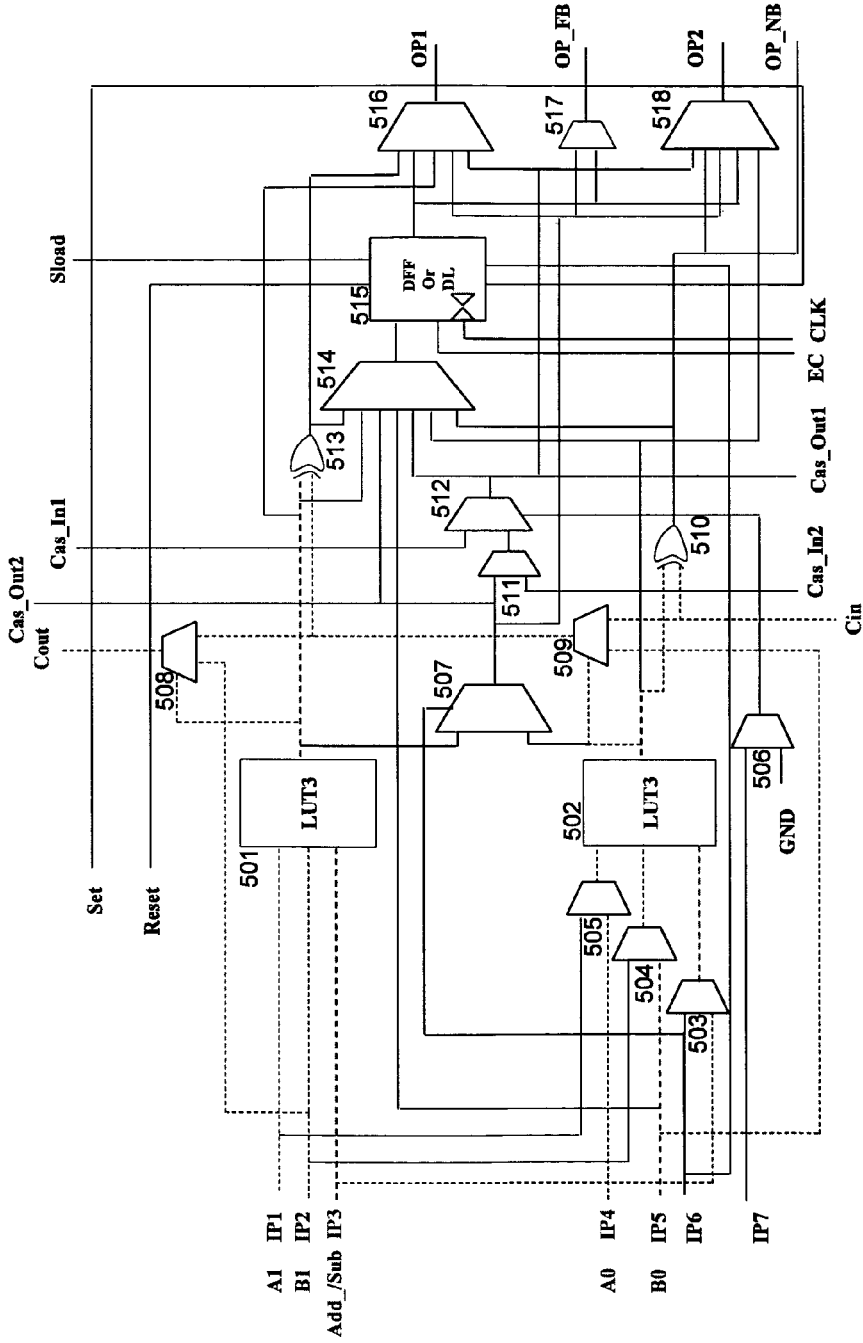
FIG. 11 illustrates a logic head operating as a 2-bit full-subtractor, in accordance with yet another embodiment of the invention.

FIG. 11 illustrates a logic head operating as a 2-bit full-subtractor, in accordance with yet another embodiment of the invention. As depicted in FIG. 11, the configuration of the logic head is the same as in the case of a full-adder, FIG. 10. The only difference is in the programming of the two LUT3s . As in the "add" mode, each LUT3 of the logic head along with a 2-to-1 multiplexer and an XOR can be configured to function as a 1-bit subtractor. Therefore, by cascading the two 1-bit subtractors within a logic head, each logic head can perform a 2-bit full subtraction. For this configuration, IP4 and IP5 represent the least significant bits and IP1 and IP2 represent the most significant bits of the addends, respectively. In this configuration IP3, which inputs both LUT3s , specifies the "subtract" operation. For this arrangement multiplexers 503, 504, and 505 must be programmed to pass through IP3, IP5, and IP4, respectively.

Assuming IP3 specifies a "subtract" operation, LUT3 502 is so programmed that the XORing of its output with the $C_{in}$ results in the subtraction of the least significant bits $A_0$ and $B_0$, while taking into account the carry-in bit). And the output of multiplexer 509, controlled by the output of LUT3 502 is the carry-out bit of the same subtraction. This is possible, for example, by programming LUT3 502 according to the following truth table:

| IP3 | $A_0$ | $B_0$ | LUT3 502 output | MUX 509 output | XOR 510 output |
|---|---|---|---|---|---|
| Subtract | 0 | 0 | 0 | $C_{in}$ | $C_{in}$ |
| Subtract | 0 | 1 | 1 | $B_0$ | $!C_{in}$ |
| Subtract | 1 | 0 | 1 | $B_0$ | $!C_{in}$ |
| Subtract | 1 | 1 | 0 | $C_{in}$ | $C_{in}$ |

Similar arrangement is needed for the subtraction of the second most significant bits, using the output of multiplexer 509 as its carry-in bit. Therefore, assuming IP3 specifies a "subtract" operation, LUT3 501 is programmed such that the XORing of its output with the output of multiplexer 509 results in the subtraction of the most significant bits, $A_1$ and $B_1$, while taking into account the output of multiplexer 509 as a carry-in bit. And the output of multiplexer 508, controlled by the output of LUT3 501 is the carry-out bit of the same subtraction. This is possible, for example, by programming LUT3 501 according to the following truth table:

| IP3 | $A_1$ | $B_1$ | LUT3 501 output | MUX 508 output | XOR 513 output |
|---|---|---|---|---|---|
| Subtract | 0 | 0 | 0 | MUX 509 output | MUX 509 output |
| Subtract | 0 | 1 | 1 | $B_1$ | !(MUX 509 output) |
| Subtract | 1 | 0 | 1 | $B_1$ | !(MUX 509 output) |
| Subtract | 1 | 1 | 0 | MUX 509 output | MUX 509 output |

In this configuration, for example, OP2 and OP1 can output the least and the most significant bits of the 2-bit subtraction result, respectively, while $C_{out}$ is the carry-out bit of the same 2-bit subtraction.

Figure 12:
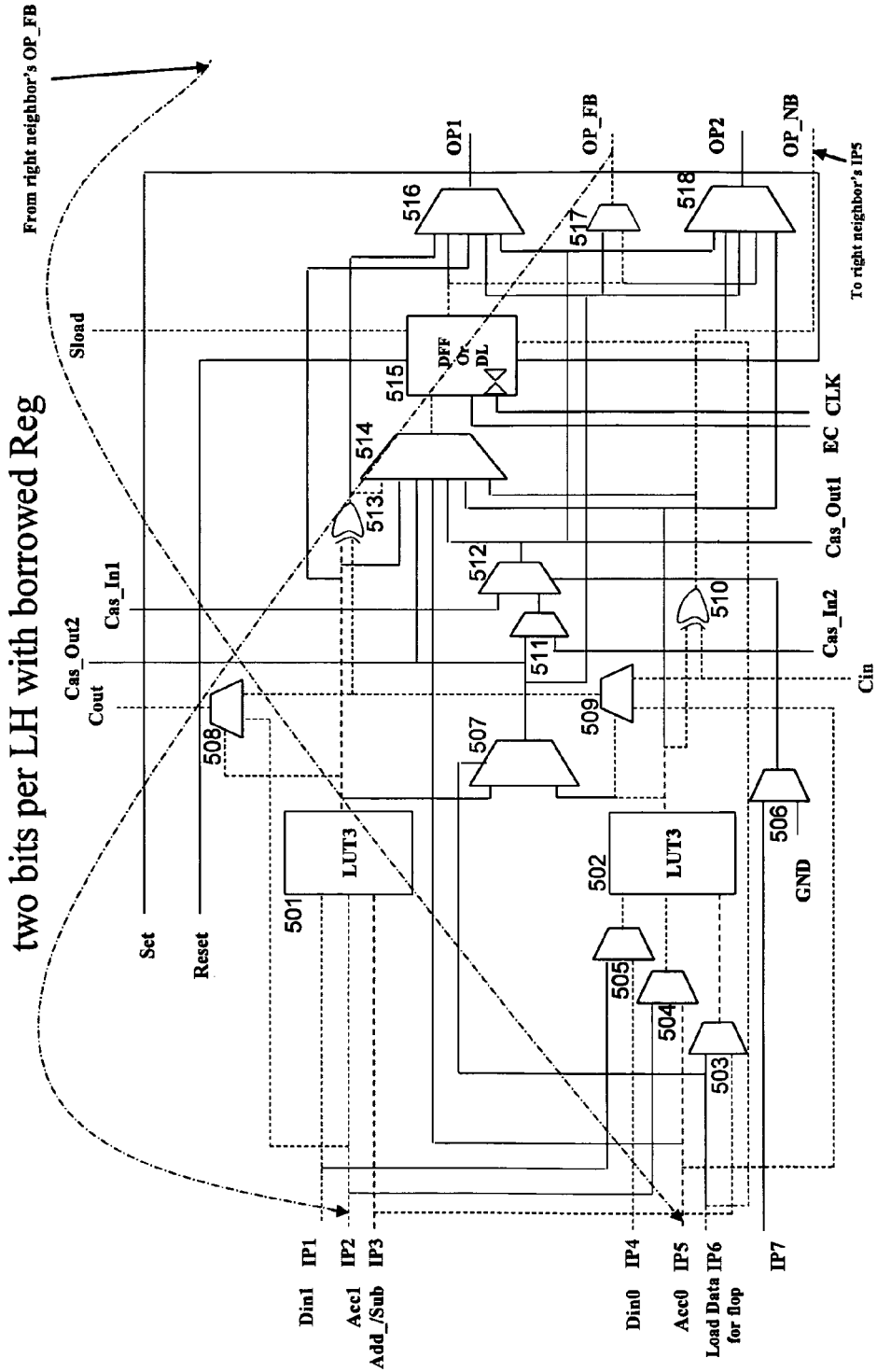
FIG. 12 illustrates a logic head operating as a 2-bit accumulator, in accordance with yet another embodiment of the invention.
Figure 13:
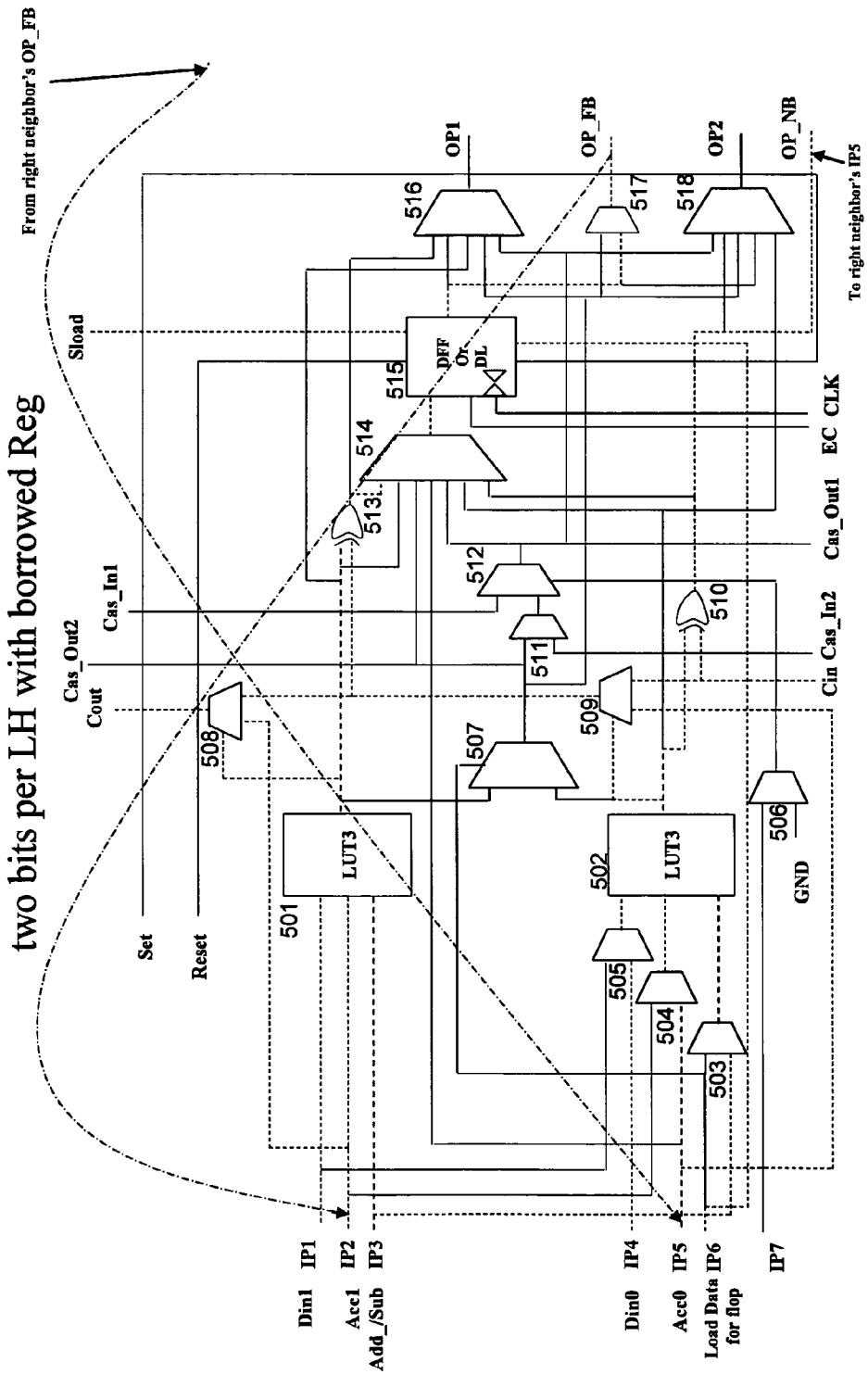
FIG. 13 illustrates a logic head operating as a 2-bit counter, in accordance with yet another embodiment of the invention.

FIGS. 12 and 13 illustrate a logic head operating as a 2-bit accumulator and a 2-bit counter, respectively. As depicted in FIGS. 12 and 13, at the core of these two configurations is the add/subtract arrangements discussed in relation to FIGS. 10 and 11. Since accumulators and counters are sequential machines, the DFF 515 of each logic head and one DFF borrowed from its neighbor are used to store its state to be subsequently fed back as required by accumulators or counters. Furthermore, the DFF 515 of each logic head can be synchronously loaded by IP6, while Sload acts as the DFF's load-enabling signal.

This, for example, allows for a starting number in a count up or count down mode or for setting and resetting the accumulator or the counter. When acting as an accumulator or a counter, IP1 and IP4 hold the increment or decrement values. Knowing the necessary add and subtract arrangements of a logic head, as detailed in the preceding paragraphs, a person of ordinary skill in the relevant arts can easily configure an accumulator or a counter by consulting FIGS. 12 and 13, respectively.

Figure 14:
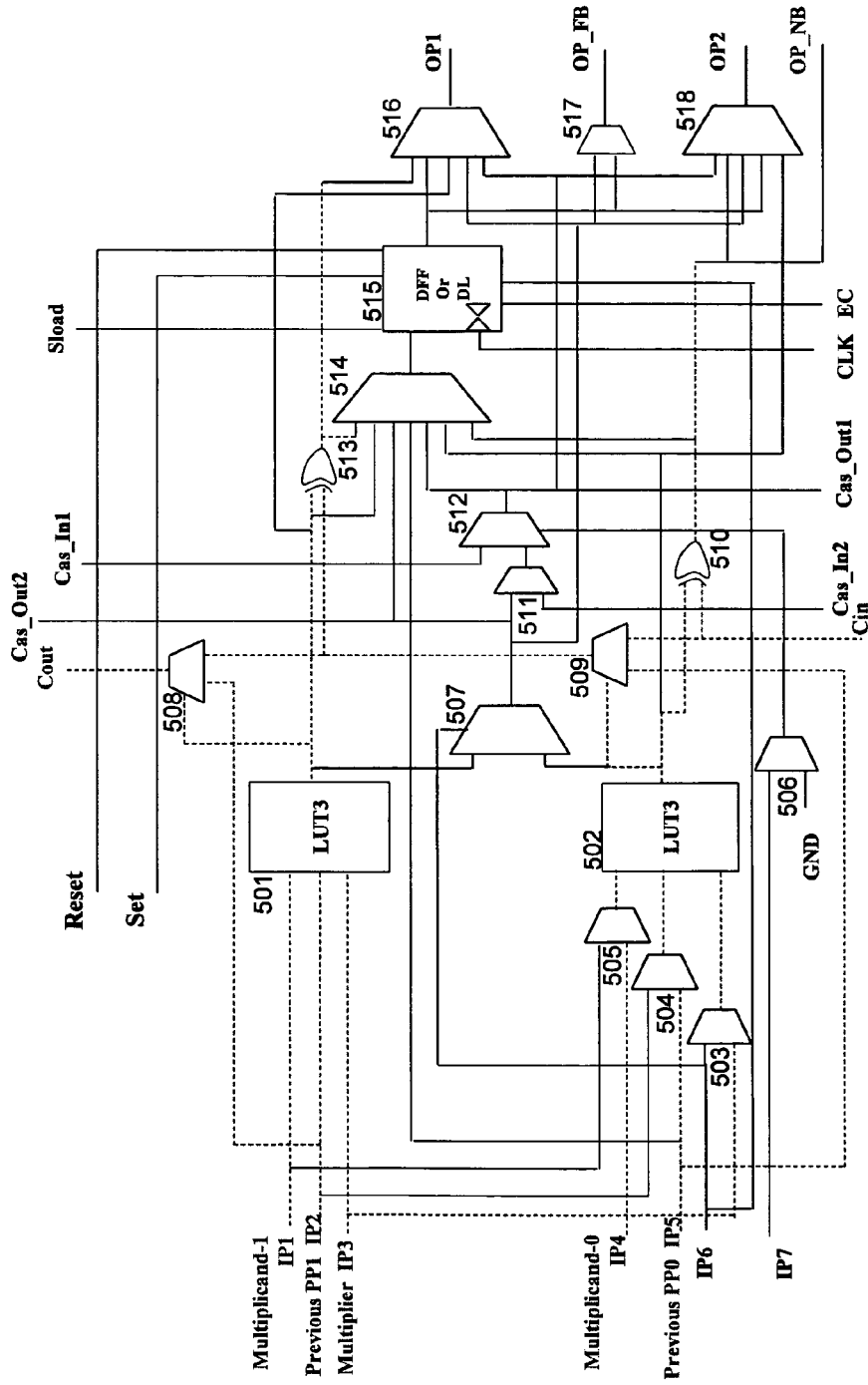
FIG. 14 illustrates a logic head in a 2-bit multiply-and-add mode, in accordance with yet another embodiment of the invention.

FIG. 14 illustrates a logic head in a 2-bit multiply-and-add mode. This logic head configuration can be the foundation of the multiplication of any two numbers. In this mode the logic head can multiply a 1-digit binary number by a first 2-digit binary number and add the result to a second 2-digit binary number, where the second 2-digit binary number can be the partial product of a previous multiplication. This is all performed while taking into account a carry-in bit.

At the core of multiply-and-add configuration is the add/subtract arrangement presented in FIGS. 10 and 11, with the 2-digit multiplicand $M_1M_0$ as one of the addends and the partial product $P_1P_0$ as the other addend and the multiplier bit MB as a control bit. If MB=1, then $M_1M_0$ will be added to $P_1P_0$, but if MB=0, then 00 is added to $P_1P_0$. For such a function, multiplexers 503, 504, and 505 are programmed to pass through $M_0$, $P_0$, and MB, respectively, and the LUT3s are programmed as suggested in the following tables:

For MD=1, LUT3 501 is also programmed as follows:

| MB | $M_0$ | $P_0$ | LUT3 502 output | MUX 509 output | XOR 510 output |
|---|---|---|---|---|---|
| 1 | 0 | 0 | 0 | $P_0$ | $C_{in}$ |
| 1 | 0 | 1 | 1 | $C_{in}$ | $!C_{in}$ |
| 1 | 1 | 0 | 1 | $C_{in}$ | $!C_{in}$ |
| 1 | 1 | 1 | 0 | $P_0$ | $C_{in}$ |

For MB=1, LUT3 501 is also programmed as follows:

| MB | $M_1$ | $P_1$ | LUT3 501 output | MUX 508 output | XOR 513 output |
|---|---|---|---|---|---|
| 1 | 0 | 0 | 0 | $P_1$ | MUX 509 output |
| 1 | 0 | 1 | 1 | MUX 509 output | !(MUX 509 output) |
| 1 | 1 | 0 | 1 | MUX 509 output | !(MUX 509 output) |
| 1 | 1 | 1 | 0 | $P_1$ | MUX 509 output |

But for MB=0, LUT3 502 is programmed as follows:

| MB | $P_0$ | LUT3 502 output | MUX 509 output | XOR 510 output |
|---|---|---|---|---|
| 0 | 0 | 0 | $P_0$ | $C_{in}$ |
| 0 | 1 | 1 | $C_{in}$ | $!C_{in}$ |
| 0 | 0 | 0 | $P_0$ | $C_{in}$ |
| 0 | 1 | 1 | $C_{in}$ | $!C_{in}$ |

For MB=0, LUT3 501 is also programmed as follows:

| MB | $P_1$ | LUT3 501 output | MUX 508 output | XOR 513 output |
|---|---|---|---|---|
| 0 | 0 | 0 | $P_1$ | MUX 509 output |
| 0 | 1 | 1 | MUX 509 output | !(MUX 509 output) |
| 0 | 0 | 0 | $P_1$ | MUX 509 output |
| 0 | 1 | 1 | MUX 509 output | !(MUX 509 output) |

As depicted in the case of MB=0, the output of LUT3 502 is its $P_0$ input and the output of LUT3 501 is its $P_1$ input.

Figure 15:
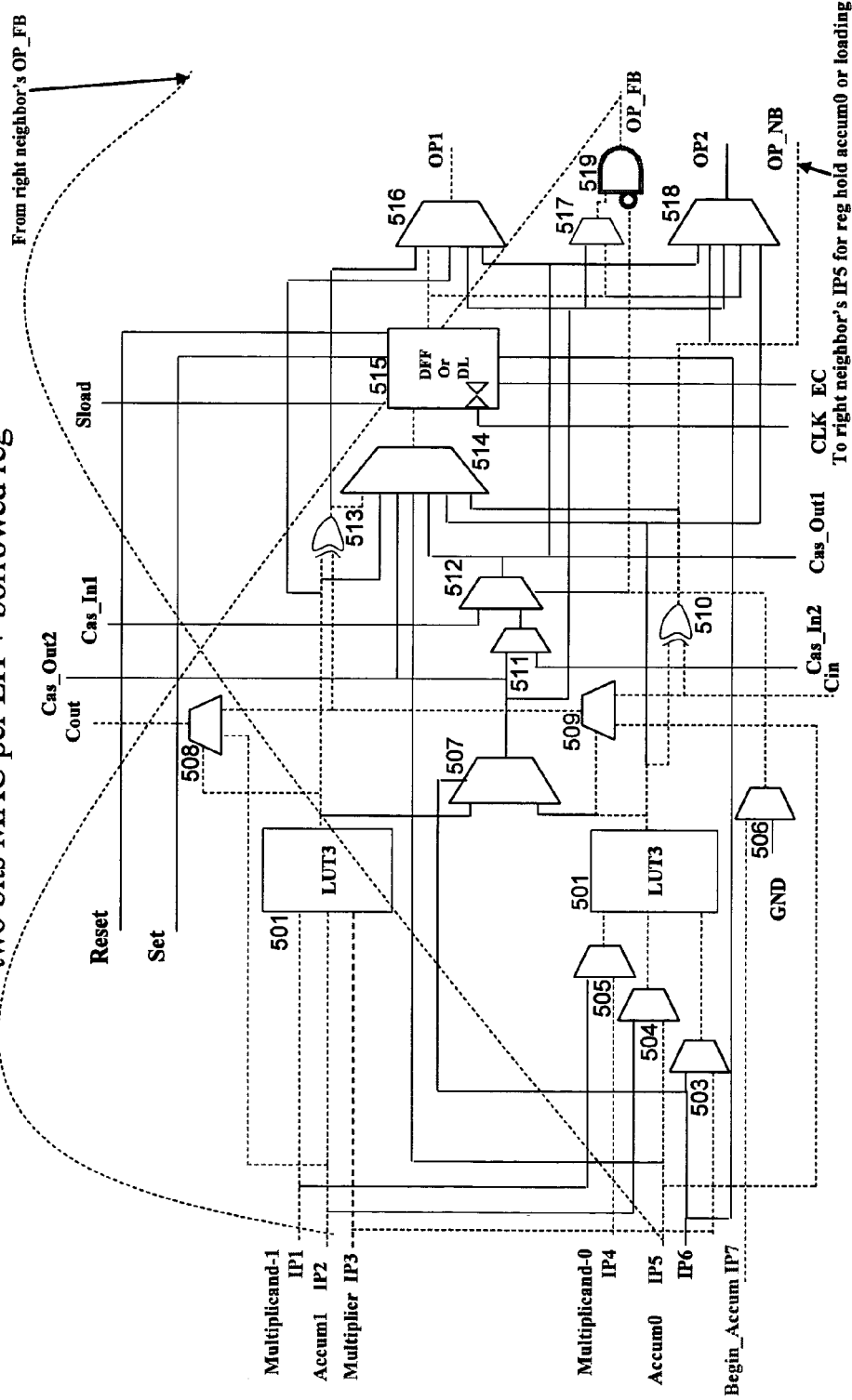
FIG. 15 illustrates a logic head in a 2-bit multiply-and-accumulate mode, in accordance with yet another embodiment of the invention.

FIG. 15 illustrates a logic head in a 2-bit multiply-and-accumulate mode, in accordance with yet another embodiment of the invention. In this mode the logic head can multiply a 1-digit binary number by a first 2-digit binary number and add the result to a second 2-digit binary number, where the second 2-digit binary number can be the accumulation result of previous multiplications. This is all performed while taking into account a carry-in bit.

At the core of this configuration is the multiply-and-add arrangement presented in FIG. 14. Since accumulation is a sequential process, the DFF 515 of each logic head and one DFF borrowed from its neighbor are used to store its state, to be subsequently fed back as required by accumulators. Knowing the multiply-and-add arrangements of a logic head, as detailed in the preceding paragraphs, a person of ordinary skill in the relevant arts can easily configure a multiply and-accumulate logic head by consulting FIG. 15.

Although in one embodiment the logic heads of an FPGA may connect to each other through the routing channels, in another embodiment every few of the logic heads, such as a cluster of 8 or 16 logic heads, can be locally connected to each other, without using the routing channels, to perform specific tasks more efficiently and more economically. However, the clusters may use routing channels to connect to each other or to other logic heads. FIGS. 16 to 23 illustrate some aspects of logic head clusters (LHCs) in accordance with different embodiments of this invention.

Figure 16:
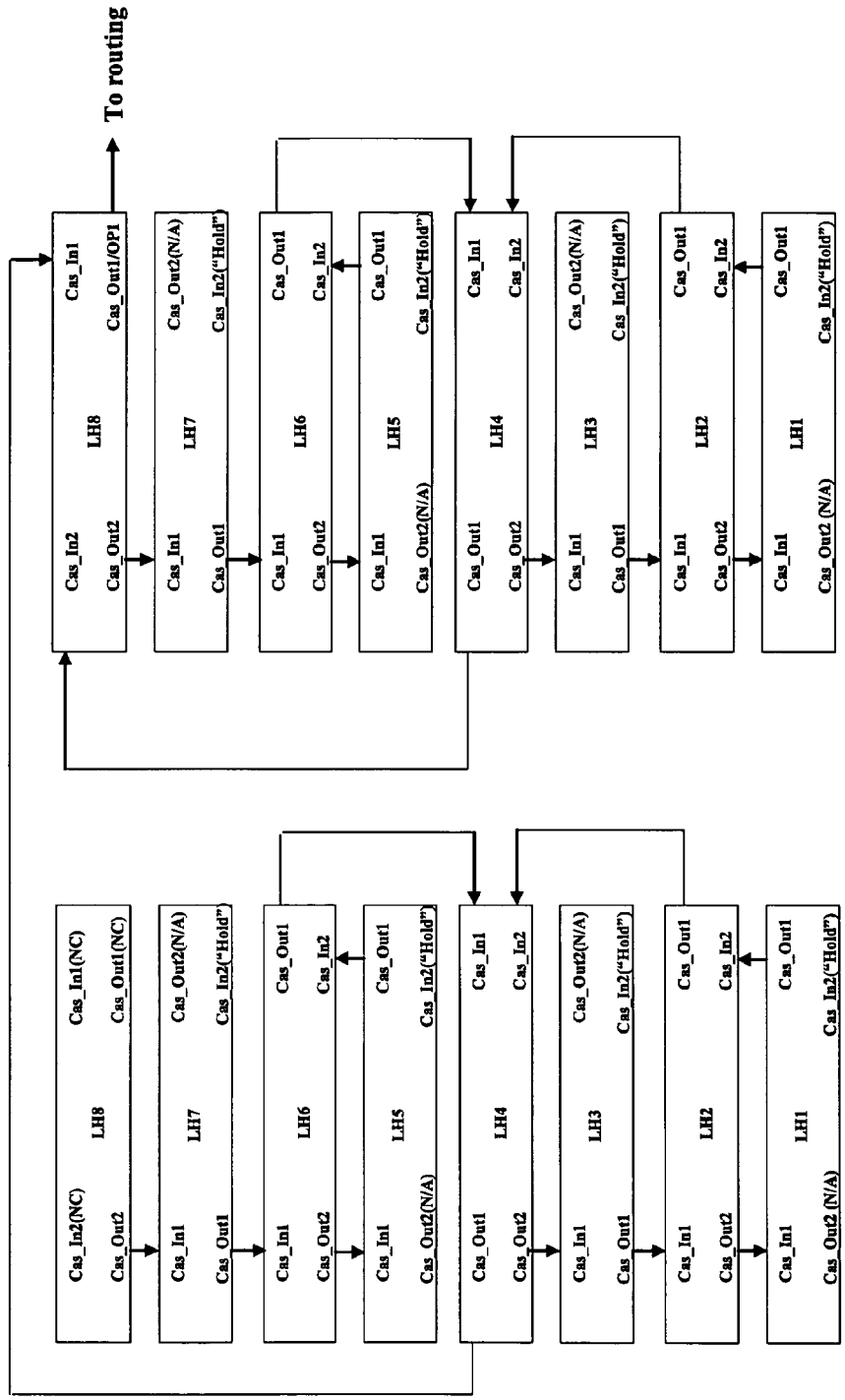
FIG. 16 is a high level interconnection schematic diagram of logic heads within a cluster of 16 logic heads, in accordance with yet another embodiment of the invention.
Figure 17:
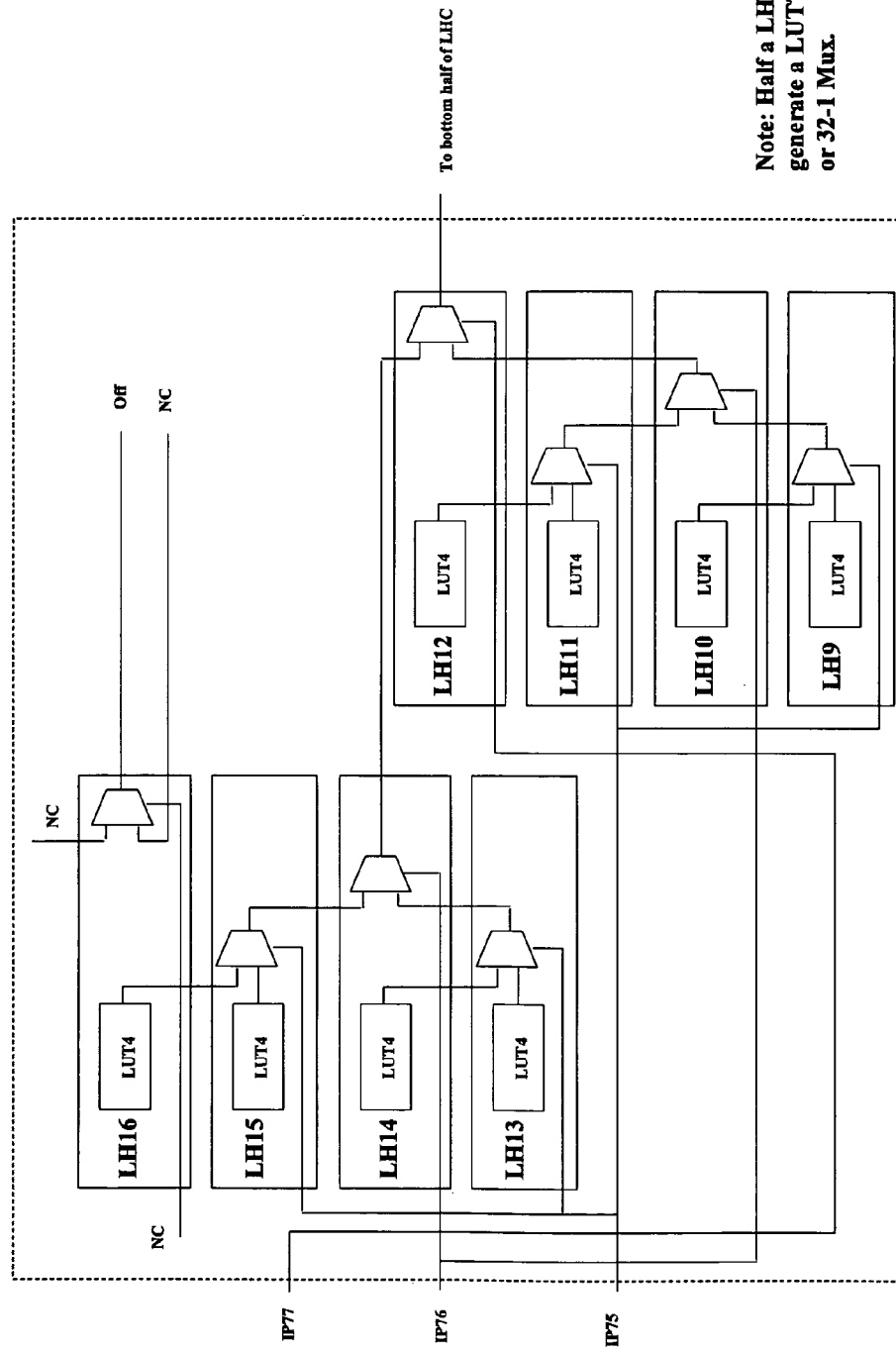
FIGS. 17 and 18 illustrate interconnections of a 7-input look-up table or a 32-to-1 multiplexer using half of a 16-logic-head-cluster, and the connection between the two halves of a cluster to function as an 8-input look-up table or a 64-to-1 multiplexer, in accordance with yet another embodiment of the invention.
Figure 18:
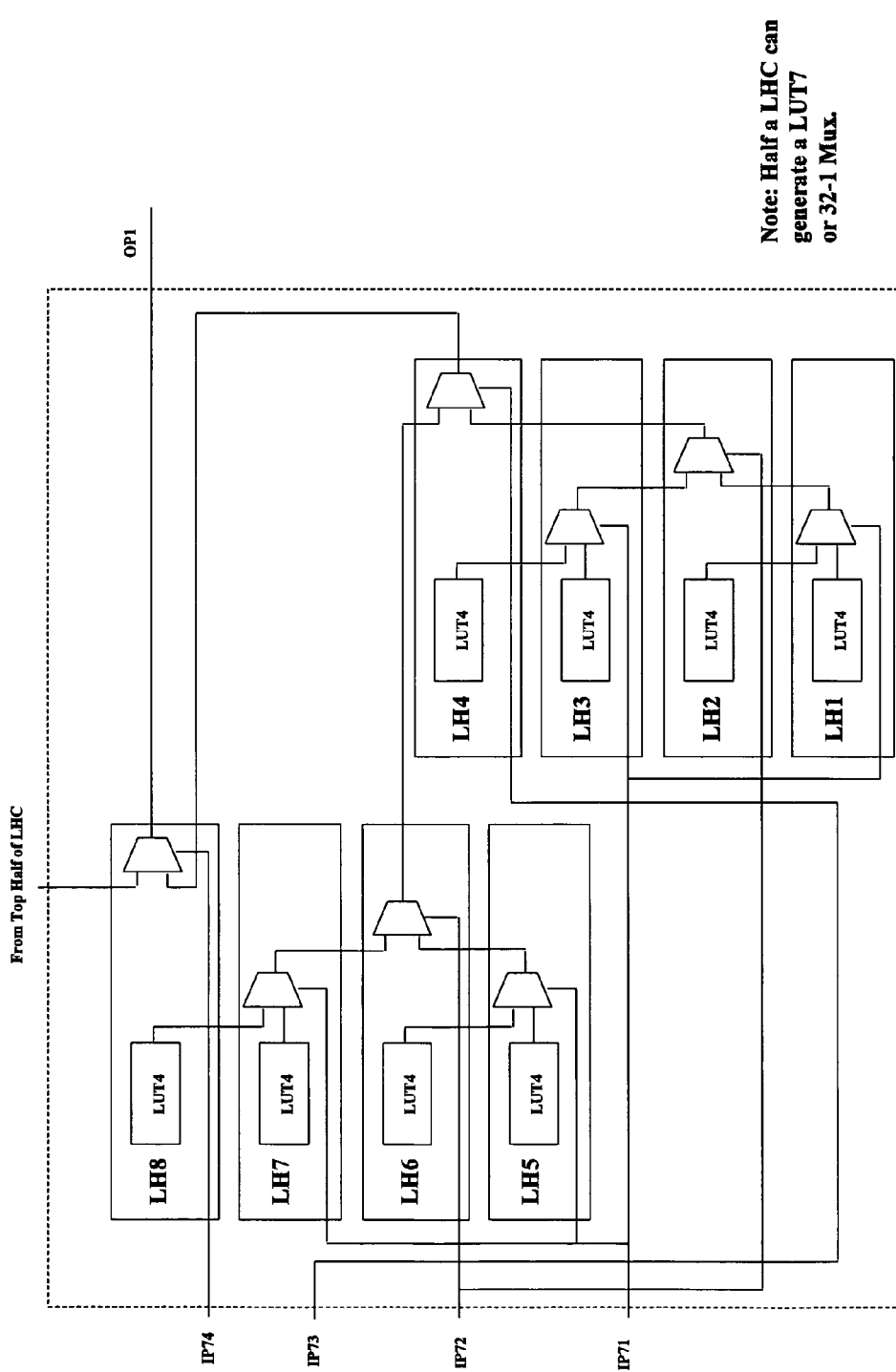

A 16 logic head cluster can generate one 64-to-1, two 32-to-1, four 16-to-1, eight 8-to-1, or sixteen 4-to-1 multiplexers, or 2- to 8-input look-up tables. FIG. 16 illustrates a high level interconnection of logic heads within a cluster of 16 logic heads. FIGS. 17 and 18 illustrate interconnections of a 7-input look-up table or a 32-to-1 multiplexer using half of a 16-logic-head-cluster, and the connection between the two halves of a cluster to function as an 8-input look-up table or a 64-to-1 multiplexer, in accordance with yet another embodiment of the invention. Knowing the detail arrangements of a LUT4 logic head, as described in the preceding paragraphs, a person of ordinary skill in the relevant arts can easily configure a 7-input look-up table, a 32-to-1 multiplexer, an 8-input look-up table, or a 64-to-1 multiplexer by consulting FIGS. 16–18.

Figure 19:
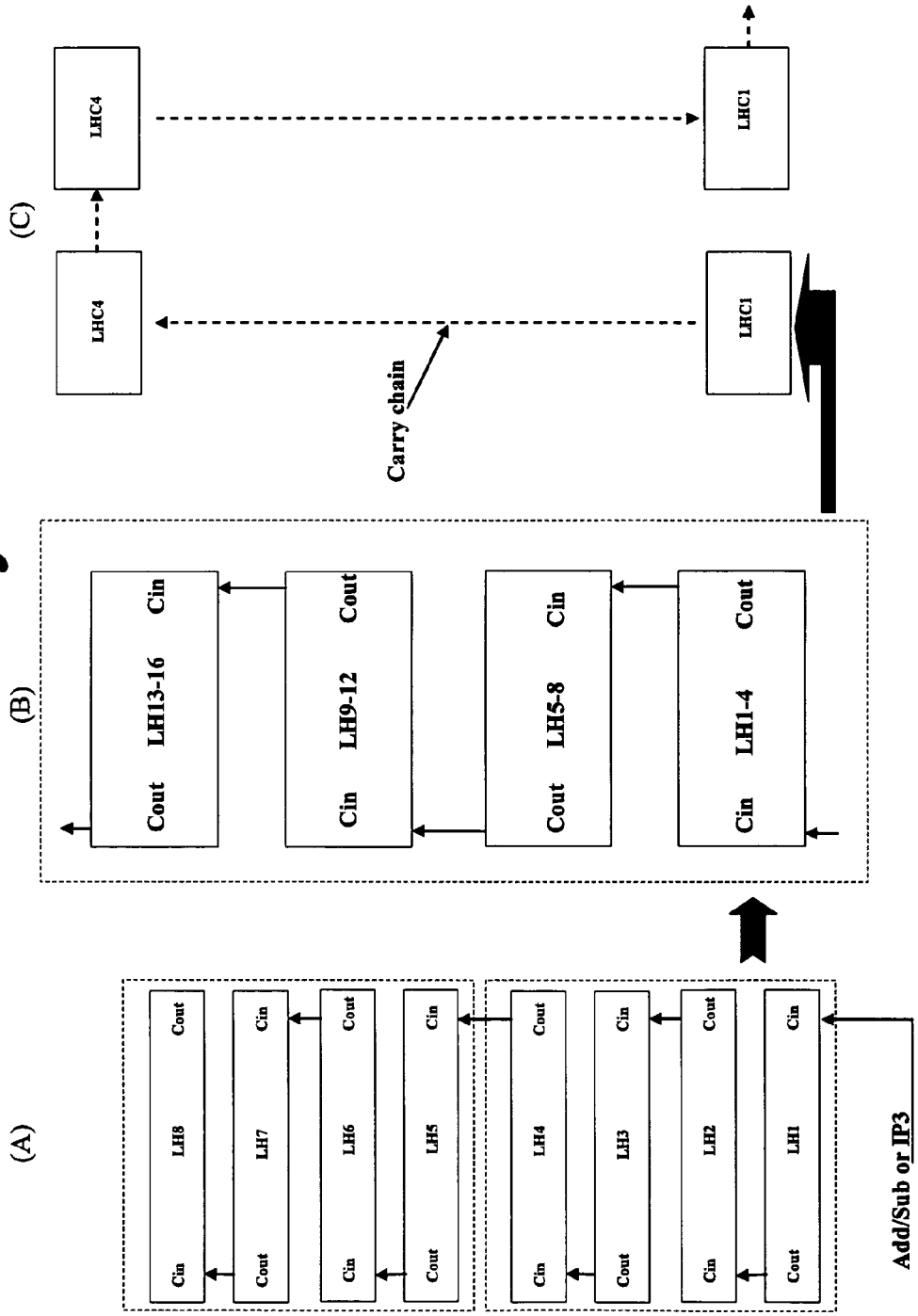
FIG. 19 illustrates different details of interconnections, within and without an LHC, to form a carry chain, in accordance with yet another embodiment of the invention.
Figure 20:
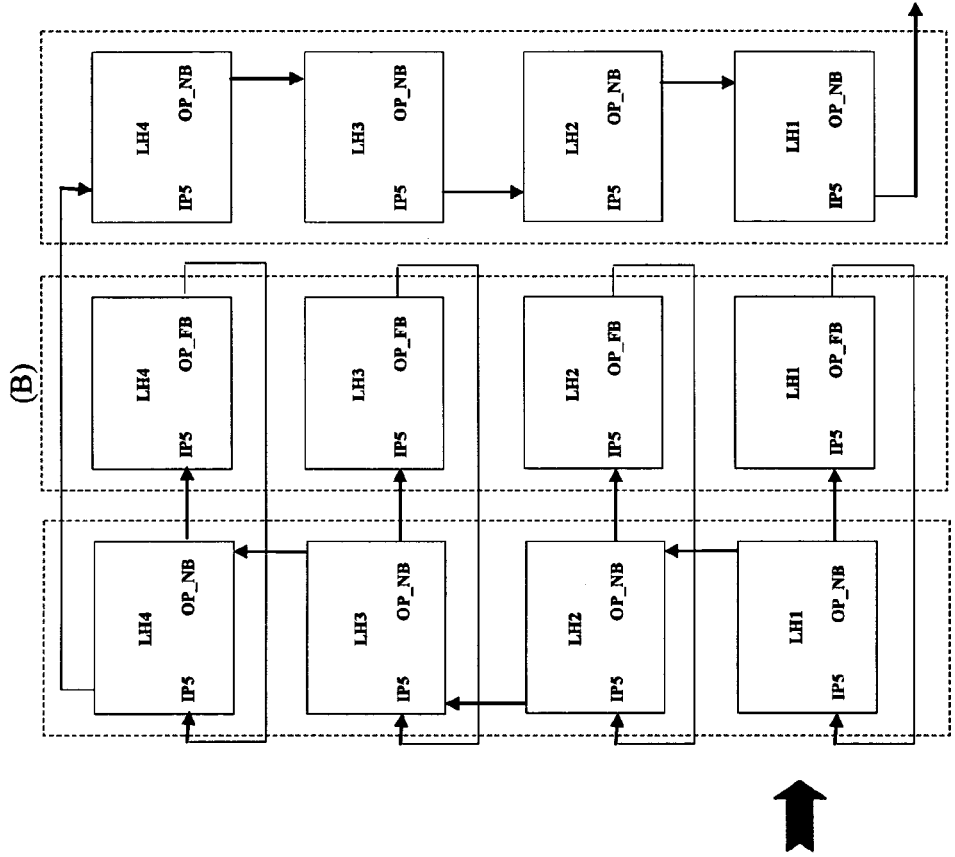
FIG. 20 is a detailed depiction of logic head interconnections within an LHC to form a counter, in accordance with yet another embodiment of the invention.
Figure 20:
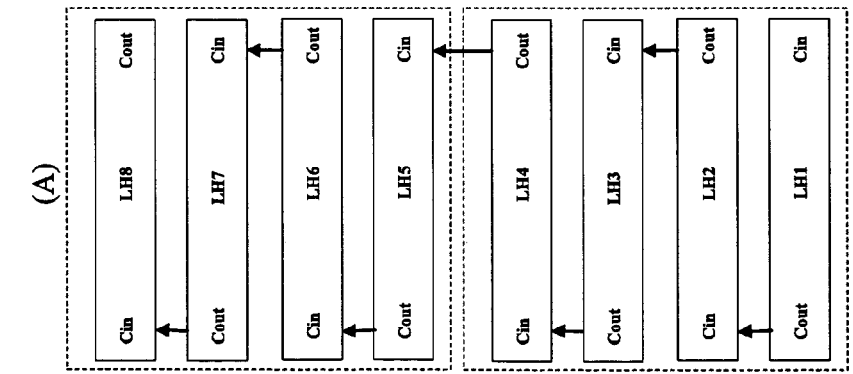

FIG. 19 illustrates different details of interconnections, within and without an LHC, to form a carry chain to implement, for example, counters or accumulators, in accordance with yet another embodiment of the invention. FIG. 19A depicts the interconnections among one half of a cluster's logic heads, whereas FIG. 19B shows the interconnections of a complete LHC. As further shown in FIG. 19C, LHCs can connect to each other, for example through U-shaped connections using routing channels, to implement chip-wide counters and accumulators, among other functions, FIG. 20 is a detailed depiction of logic head interconnections within an LHC to form a counter, in accordance with yet another embodiment of the invention. As previously described with respect to FIG. 13, in the counting mode, the DFFs of every other columns of the logic heads can be used by its neighboring column of logic heads. FIG. 20B demonstrates the interconnections for borrowing DFFs from neighboring logic heads, along with the interconnections to pass on the carry bits from logic head to logic head.

Figure 21:
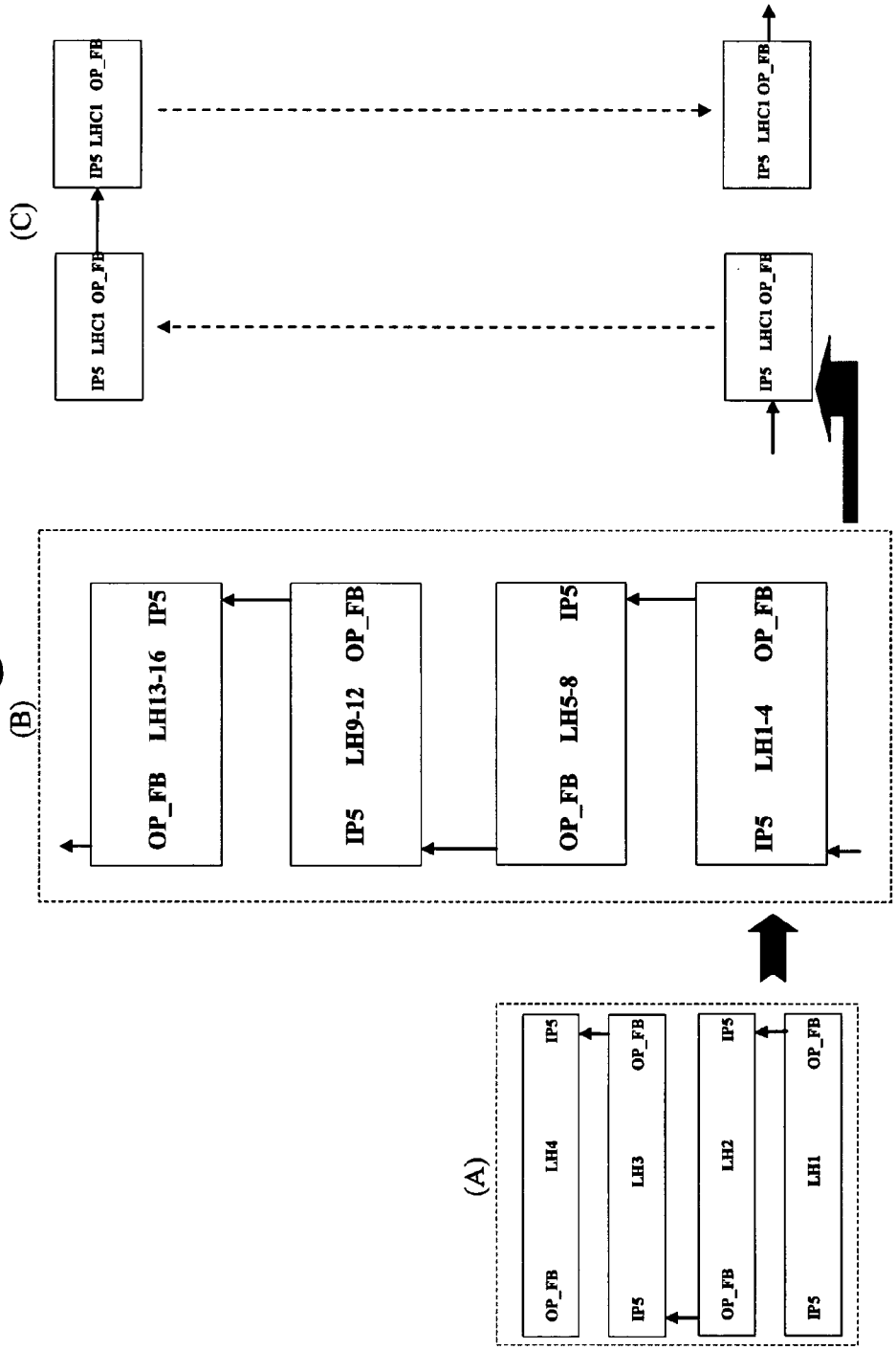
FIG. 21 illustrates different details of interconnections, within and without an LHC, to form a register chain, in accordance with yet another embodiment of the invention.

FIG. 21 illustrates different details of interconnections, within and without an LHC, to form a register chain, in accordance with yet another embodiment of the invention. FIG. 21A depicts the interconnections among four logic heads, whereas FIG. 21B shows the interconnections of a complete LHC. As further shown in FIG. 21C, LHCs can connect from column to column, for example through U-shaped connections using routing channels, to implement chip-wide registers or as wide of a register as desired.

Figure 22:
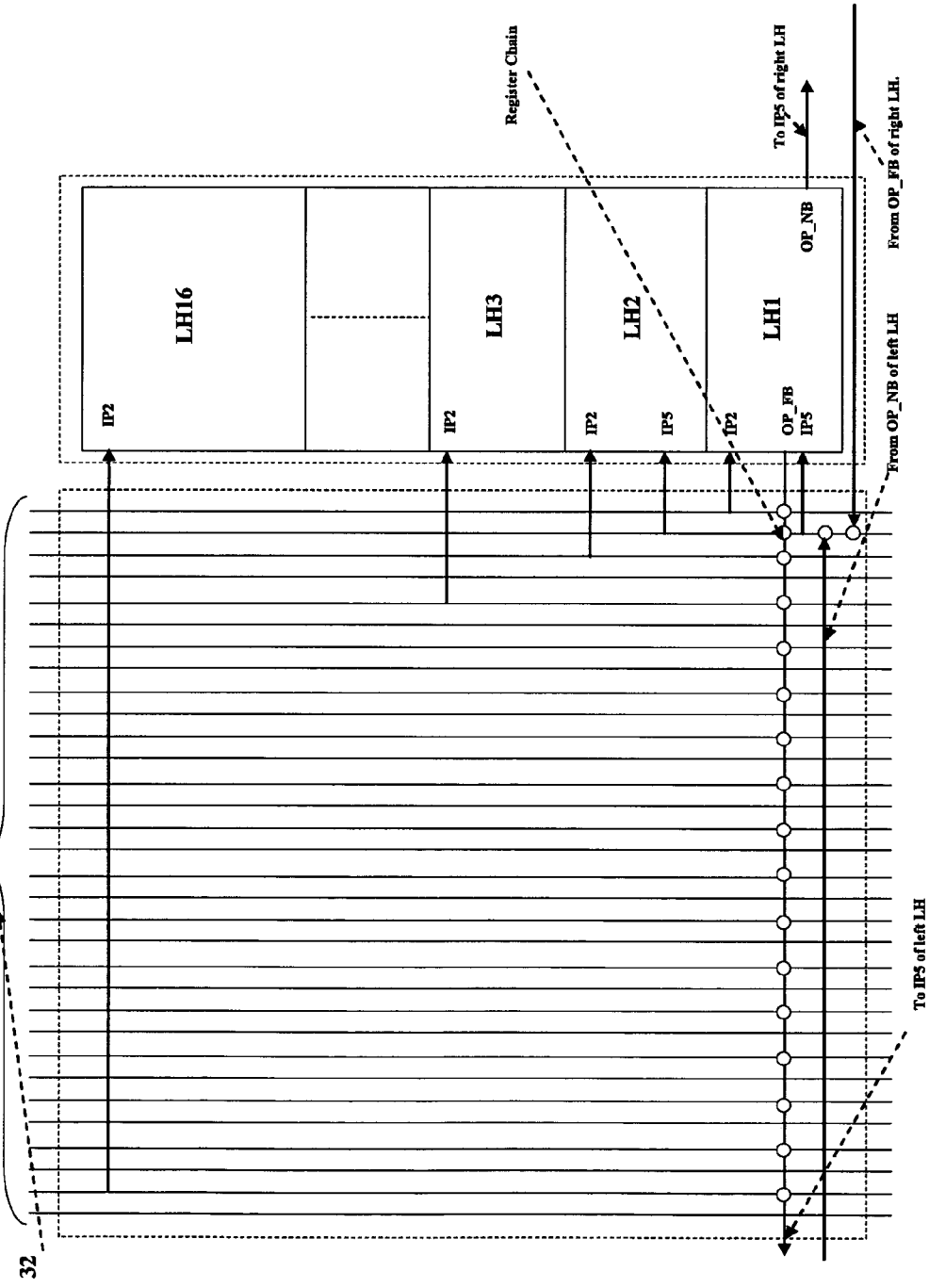
FIG. 22 illustrates an example of the local routing of an LHC, in accordance with yet another embodiment of the invention.

FIG. 22 illustrates an example of the local routing of an LHC, in accordance with yet another embodiment of the invention. There are full feedback paths within each LHC such that OP_FB of any logic head can be routed to IP2 of any other logic head, including itself, or from OP_FB of a logic head to IP5 of another logic head above it in case of a register chain. Also, in accumulating and counting modes, register borrowing connection exists between a logic head and its neighbor. In these modes a complete loop is formed from OP_NB of a logic head to IP5 of, for example, its right neighbor to OP_FB of the same neighbor to IP5 of the logic head.

Figure 23:
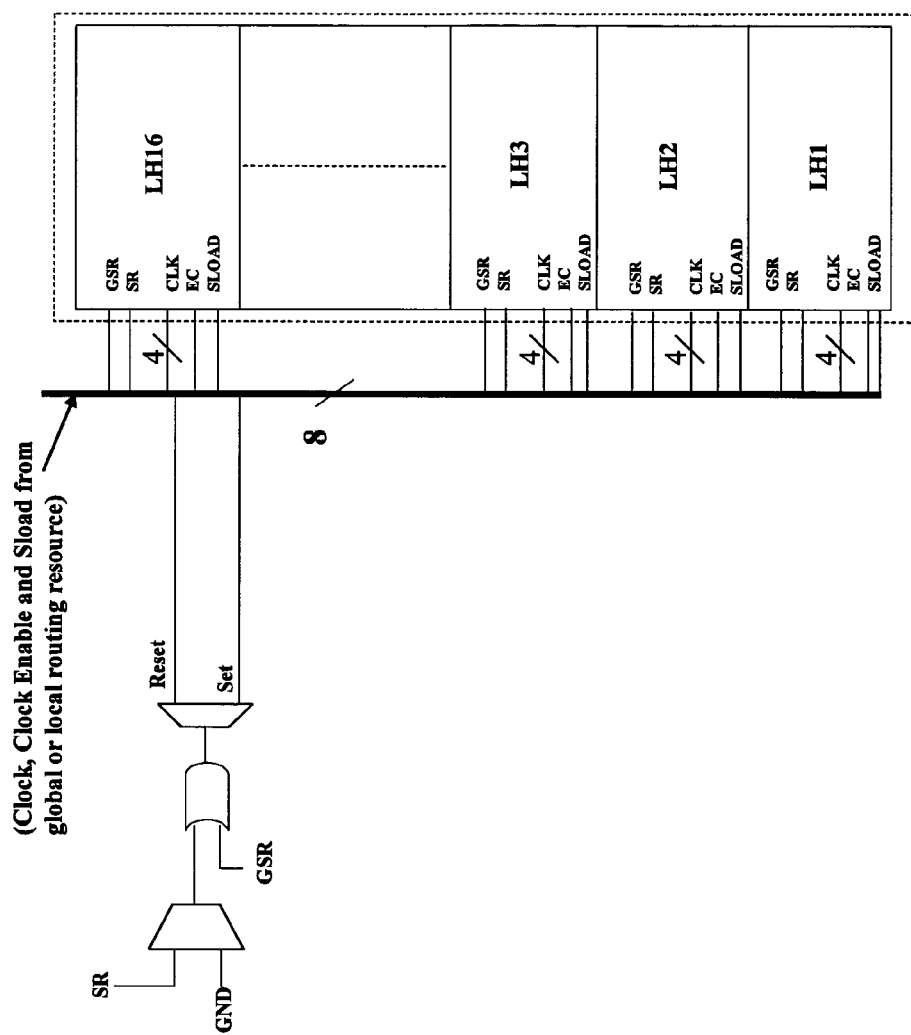
FIG. 23 illustrates an example of the local routing of the control signals of an LHC, in accordance with yet another embodiment of the invention.

FIG. 23 illustrates an example of the local routing of the control signals of an LHC. There are a total of eight control signals that are shared between all logic heads of a LHC; four clock signals, one clock enable, one set, one reset, and one synchronous-load signal. The Clock, Clock Enable, and Sload signals may use the global or the local routing resources. The control signals are programmably connected to the logic heads.

Figure 24:
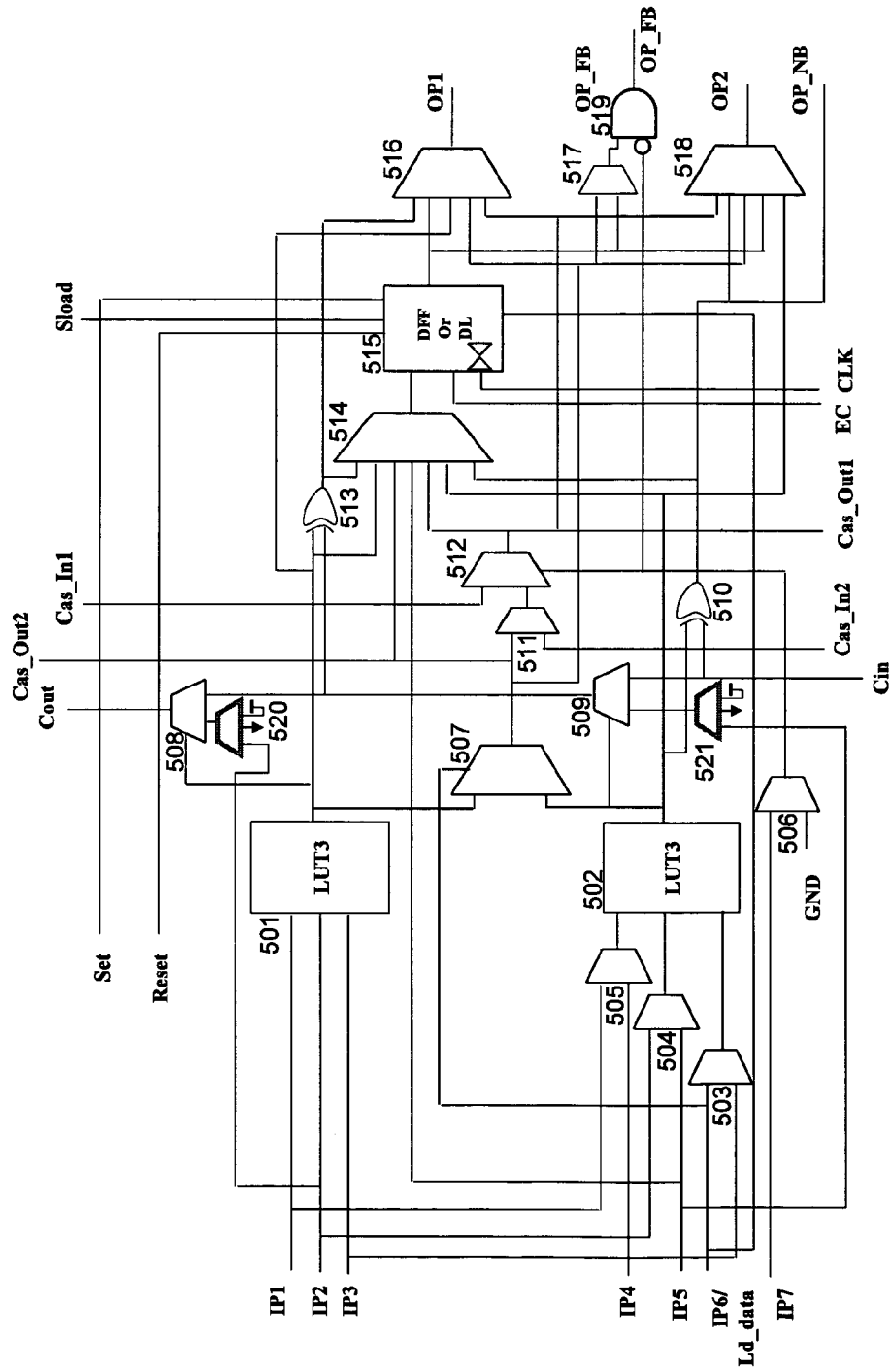
FIG. 24 is a schematic circuit diagram of a logic head capable of performing as a multiple input AND or multiple input OR gate among other functions, in accordance with an embodiment of the invention.

FIG. 24 is a schematic circuit diagram of a logic head, in accordance with an embodiment of the invention. In this embodiment a logic head has two extra 3-to-1 multiplexers, 520 and 521, compared to the logic head presented in FIG. 5. As depicted in FIG. 24, IP2 enters multiplexer 520 as one of its three inputs, instead of entering multiplexer 508, while the output of multiplexer 520 replaces IP2 as one of the two inputs of multiplexer 508. The same way, IP5 enters multiplexer 521 as one of its three inputs, instead of entering multiplexer 509, while the output of multiplexer 521 replaces IP5 as one of the two inputs of multiplexer 509. Also, in this embodiment, the second input of the multiplexer 520 and the second input of the multiplexer 521 are connected to the ground and the third input of both multiplexer are connected to the power supply voltage.

The arrangement of FIG. 24 makes it possible to use the logic head as a 6-input AND or a 6-input OR gate, with $C_{out}$ as the gate's output, provided that $C_{in}$ is set to an appropriate logic level. A cascading chain of these logic heads can create an AND or an OR gate with more than 6 inputs. In addition to the 6-Input gates, these new additions enable Summing (ORing) or ANDing to occur at any point in the chained logic.

For example to implement a 6-input AND gate, the $C_{in}$ of the logic head is set to logic level. '1,' and both multiplexers 520 and 521 are configured to pass a logic level '0' through (which may be their ground or power supply voltage). Furthermore LUT3 501 and 502 are programmed such that their outputs are '0,' if any of their three inputs is '0.' With this arrangement if all three inputs to LUT3 502 are '1's, multiplexer 509 will let the $C_{in}$, which is a '1,' to pass through, otherwise the output of multiplexer 521, which is a '0,' will pass through. Similarly if all the inputs to LUT3 501 are '1's, multiplexer 508 lets the output of the multiplexer 509 to pass through otherwise the output of the multiplexer 520, which is a '0,' will pass through and appear at $C_{out}$.

In effect, first LUT3 502 performs an AND operation on its three inputs and the $C_{in}$, and then LUT3 501 performs another AND operation on the result of the first AND operation and its own three inputs. It is not hard for a person skilled in the relevant art to realize that a cascade of N such logic heads, where the $C_{out}$ of one is connected to the $C_{in}$ of its neighboring logic head, creates a 6N-input AND gate.

Likewise, to implement a 6-input OR gate, the $C_{in}$ of the logic head is set to logic level '0,' and both multiplexers 520 and 521 are configured to pass a logic level '1' through (which may be their ground or power supply input). Also, LUT3 501 and 502 are programmed such that their outputs are '1,' if any of their three inputs is '1.' With this arrangement if all three inputs to LUT3 502 are '0's, multiplexer 509 will let the $C_{in}$, which is a '0,' to pass through, otherwise the output of multiplexer 521, which is a '1,' will pass through. Similarly if all the inputs to LUT3 501 are '0's, multiplexer 508 lets the output of the multiplexer 509 to pass through otherwise the output of the multiplexer 520, which is a '1,' will pass through to $C_{out}$.

In effect, here also, LUT3 502 first performs an OR operation on its three inputs and the $C_{in}$, and later LUT3 501 performs another OR operation on the result of the first OR operation and its own three inputs. Again, it is not hard for a person skilled in the relevant art to realize that a cascade of N such logic heads, where the $C_{out}$ of one is connected to the $C_{in}$ of its neighboring logic head, creates a 6N-input OR gate. The same capability is achieved, using DeMorgan's theorem, by setting $C_{in}$ to '1,' configuring multiplexers 520 and 521 to pass a '0,' and inverting $C_{out}$. With such an arrangement, multiplexers 520 and 521 can be minimized to merely have two-inputs instead of three. However, for some additional capabilities, described in the next paragraph, three-input multiplexers 520 and 521 are required.

With three-input multiplexers 520 and 521, a logic chain can convert from an AND chain to an OR chain, creating sum-of-products or product-of-sums logic, at any level in the chain. This is possible because of the two multiplexers' 520 and 521 capability to control the $C_{out}$ value as required by the logic synthesis. For example, at one level of the logic chain the logic heads can be programmed to perform an OR operation, where at another level of the logic chain the logic heads are programmed to perform an AND operation.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. When the claims use the word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above Detailed Description. While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

I claim:

1. A logic head, comprising:
3-input look-up tables, multiplexers, XOR gates, registers, two output ports, a carry-in port, and a carry-out port, wherein at least one multiplexer is a standard multiplexer and one is hard-wired, and wherein the logic head can be configured to function as a 2-bit full-adder/subtractor, a counter, an accumulator, a 4-to-1 multiplexer, two 2-to-1 multiplexers, a 4-input look-up table, two 3-input look-up tables, two 2-input look-up table, one 3-input and one 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions.

2. The logic head of claim 1, wherein there are three to seven inputs, three of which can be shared by the 3-input look-up tables.

3. The logic head of claim 1, wherein the registers are D flip-flops.

4. The logic head of claim 1 further comprising a cascade-in and a cascade-out port.

5. The logic head of claim 1, wherein both registered and non-registered form of the outputs can be available.

6. The logic head of claim 1, further comprised of an additional dedicated AND gate for the purpose of feedback.

7. The logic head of claim 1, wherein the logic head can function in a split-mode.

8. The logic head of claim 1, further comprising control signals.

9. A field programmable gate array logic head, comprising:
3-input look-up tables, multiplexers, XOR gates, latches, two output ports, a carry-in port, a carry-out port, a cascade-in port, and a cascade-out port, wherein at least one multiplexer is a standard multiplexer and one is programmed, wherein the logic head can be configured to function as a 2-bit full-adder/subtractor, a counter, an accumulator, a 4-to-1 multiplexer, two 2-to-1 multiplexers, a 4-input look-up table, two 3-input look-up tables, two 2-input look-up table, or one 3-input and one 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions.

10. The logic head of claim 9, wherein there are three to seven inputs, three of which can be shared by the 3-input look-up tables.

11. The logic head of claim 9, wherein the latches are D flip-flops.

12. The logic head of claim 9, wherein both registered and non-registered form of the outputs can be available.

13. The logic head of claim 9, further comprised of an additional dedicated AND gate for the purpose of feedback.

14. The logic head of claim 9, wherein the logic head can function in a split-mode.

15. The logic head of claim 9, further comprising control signals.

16. A field programmable gate array logic head, comprising:
two 3-input look-up tables, multiplexers, XOR gates, latches, two output ports, a carry-in, a carry-out, a cascade-in port, and a cascade-out port, wherein at least one multiplexer is a standard multiplexer and one is programmed, wherein the logic head can be configured to function as a 2-bit full-adder/subtractor, a counter, an accumulator, a 4-to-1 multiplexer, two 2-to-1 multiplexers, a 4-input look-up table, two 3-input look-up tables, two 2-input look-up table, or one 3-input and one 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions.

17. The logic head of claim 16, wherein there are three to seven inputs, three of which can be shared by the 3-input look-up tables.

18. The logic head of claim 16, wherein the latches are D flip-flops.

19. The logic head of claim 16, wherein both registered and non-registered form of the outputs can be available.

20. The logic head of claim 16, further comprised of an additional dedicated AND gate for the purpose of feedback.

21. The logic head of claim 16, wherein the logic head can function in a split-mode.

22. The logic head of claim 16, further comprising control signals.

23. A field programmable gate array logic head, comprising:
two 3-input look-up tables, a plurality of multiplexers, two XOR gates, a D flip-flop, two output ports, a carry-in, a carry-out, a cascade-in port, a cascade-out port, and a plurality of control signals, wherein the logic head can be configured to function as a 2-bit full-adder/subtractor, a counter, an accumulator, a 4-input look-up table, two 3-input look-up tables, two 2-input look-up table, or one 3-input and one 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions.

24. The logic head of claim 23, wherein there are three to seven inputs, three of which can be shared by the two 3-input look-up tables.

25. The logic head of claim 23, wherein both registered and non-registered form of the outputs can be available.

26. The logic head of claim 23, further comprised of an additional dedicated AND gate for the purpose of feedback.

27. The logic head of claim 23, wherein the logic head can function in a split-mode.

28. The logic head of claim 23, wherein the control signals are clock, clock enable, set, reset, and load signals.

29. A logic head, comprising:
   3-input look-up tables, multiplexers, XOR gates, latches, two output ports, a carry-in port, a carry-out port, and a plurality of control signal ports, wherein at least one multiplexer is a standard multiplexer and one is hardwired and both registered and non-registered form of the outputs can be available and the logic head can operate in split-mode, and wherein the logic head can be configured to function as a 2-bit full-adder/subtractor, a counter, an accumulator, a 4-input look-up table, a 3-input look-up table, a 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions, and wherein the logic head is capable of forming a register chain or a carry chain.

30. The logic head of claim 29, wherein there are three to seven inputs.

31. The logic head of claim 29, wherein the latches are D flip-flops.

32. The logic head of claim 29, further comprised of an additional dedicated AND gate for the purpose of feedback.

33. A field programmable gate array logic head means with two 3-input look-up tables, a plurality of multiplexers, XOR gates, a D flip-flop, two output ports, a carry-in port, a carry-out port, a cascade-in port, a cascade-out port, and a plurality of control signal ports, wherein both registered and non-registered forms of the outputs can be available and the logic head can operate in split-mode, and can be configured to function as a 2-bit full-adder/subtractor, a counter, a 4-to-i multiplexer, two 2-to-i multiplexers, an accumulator, a 4-input look-up table, a 3-input look-up table, a 2-input look-up table, two 2-, two 3-, or a 6-input AND gate, two 2-, two 3-, or a 6-input OR gate, or any combination of the said AND and OR gates, and wherein a plurality of logic heads can be configured and connected to implement sum-of-products or product-of-sums of a plurality of variable size minterms and maxterms, and arithmetic functions.

* * * * *